(12) United States Patent
Wu et al.

(10) Patent No.: US 11,784,140 B2
(45) Date of Patent: Oct. 10, 2023

(54) SEMICONDUCTOR DEVICE AND METHOD OF MANUFACTURE

(71) Applicant: Taiwan Semiconductor Manufacturing Co., Ltd., Hsinchu (TW)

(72) Inventors: Jiun Yi Wu, Zhongli (TW); Chen-Hua Yu, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/815,338

(22) Filed: Jul. 27, 2022

(65) Prior Publication Data

US 2022/0359427 A1 Nov. 10, 2022

Related U.S. Application Data

(62) Division of application No. 17/097,206, filed on Nov. 13, 2020.

(60) Provisional application No. 63/031,679, filed on May 29, 2020.

(51) Int. Cl.
*H01L 23/00* (2006.01)
*H01L 23/538* (2006.01)
*H01L 21/48* (2006.01)

(52) U.S. Cl.
CPC ........ *H01L 23/562* (2013.01); *H01L 21/4853* (2013.01); *H01L 21/4857* (2013.01); *H01L 23/5383* (2013.01); *H01L 23/5386* (2013.01); *H01L 24/16* (2013.01); *H01L 2224/16227* (2013.01); *H01L 2924/3511* (2013.01);
(Continued)

(58) Field of Classification Search
CPC ... H01L 21/4857; H01L 23/5383–5386; H01L 23/49822; H01L 23/49833; H01L 23/5385; H01L 2924/3511; H01L 2924/3512; H01L 2924/35121; H05K 2201/04–049
See application file for complete search history.

(56) References Cited

U.S. PATENT DOCUMENTS

| 8,993,380 B2 | 3/2015 | Hou et al. |
| 9,000,584 B2 | 4/2015 | Lin et al. |
| 9,048,222 B2 | 6/2015 | Hung et al. |

(Continued)

FOREIGN PATENT DOCUMENTS

| JP | 2011018948 A | 1/2011 |
| KR | 20200027419 A | 3/2020 |

(Continued)

*Primary Examiner* — Victor A Mandala
*Assistant Examiner* — Lawrence C Tynes, Jr.
(74) *Attorney, Agent, or Firm* — Slater Matsil, LLP

(57) ABSTRACT

A device includes a redistribution structure, including conductive features; dielectric layers; and an internal support within a first dielectric layer of the dielectric layers, wherein the internal support is free of passive and active devices; a first interconnect structure attached to a first side of the redistribution structure; a second interconnect structure attached to the first side of the redistribution structure, wherein the second interconnect structure is laterally adjacent the first interconnect structure, wherein the internal support laterally overlaps both the first interconnect structure and the second interconnect structure.

20 Claims, 33 Drawing Sheets

(52) U.S. Cl.
CPC ................. *H01L 2924/3512* (2013.01); *H01L 2924/35121* (2013.01)

(56) References Cited

U.S. PATENT DOCUMENTS

| | | | |
|---|---|---|---|
| 9,048,233 B2 | 6/2015 | Wu et al. | |
| 9,064,879 B2 | 6/2015 | Hung et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,299,649 B2 | 3/2016 | Chiu et al. | |
| 9,368,460 B2 | 6/2016 | Yu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,461,018 B1 | 10/2016 | Tsai et al. | |
| 9,496,189 B2 | 11/2016 | Yu et al. | |
| 9,666,502 B2 | 5/2017 | Chen et al. | |
| 9,735,131 B2 | 8/2017 | Su et al. | |
| 10,867,965 B2* | 12/2020 | Shih | H01L 25/0657 |
| 11,244,879 B2* | 2/2022 | Yu | H01L 21/6835 |
| 2009/0073670 A1* | 3/2009 | Hong | H05K 1/0271 29/830 |
| 2009/0079083 A1* | 3/2009 | Yang | H01L 23/53295 257/773 |
| 2011/0115088 A1* | 5/2011 | Lo | H01L 24/02 257/E23.011 |
| 2014/0252647 A1* | 9/2014 | Huang | H01L 24/11 257/774 |
| 2015/0140736 A1* | 5/2015 | Pendse | H01L 24/48 438/109 |
| 2015/0223318 A1* | 8/2015 | Sakamoto | H05K 1/0206 361/717 |
| 2016/0276307 A1* | 9/2016 | Lin | H01L 23/562 |
| 2017/0150603 A1* | 5/2017 | Yamamura | H05K 3/06 |
| 2018/0138151 A1* | 5/2018 | Shih | H01L 25/50 |
| 2018/0269075 A1* | 9/2018 | Li | H01L 21/486 |
| 2020/0075488 A1* | 3/2020 | Wu | H01L 24/96 |
| 2020/0083179 A1* | 3/2020 | Lee | H01L 23/5384 |
| 2020/0098707 A1* | 3/2020 | Chen | H01L 24/03 |
| 2020/0135683 A1* | 4/2020 | Kim | H01L 24/09 |
| 2020/0176378 A1* | 6/2020 | Wu | H01L 24/17 |
| 2020/0194393 A1* | 6/2020 | Wu | H01L 24/09 |
| 2020/0243449 A1* | 7/2020 | Chiang | H01L 23/5386 |
| 2020/0395308 A1* | 12/2020 | Wu | H01L 21/4853 |
| 2020/0411444 A1* | 12/2020 | Tsai | H01L 24/32 |
| 2021/0020556 A1* | 1/2021 | Wu | H01L 21/4857 |
| 2021/0098353 A1* | 4/2021 | Wu | H01L 23/15 |
| 2021/0118835 A1* | 4/2021 | Wu | H01L 23/5385 |
| 2021/0223489 A1* | 7/2021 | Weng | H01L 21/563 |
| 2021/0225666 A1* | 7/2021 | Lin | H01L 21/563 |
| 2021/0271020 A1* | 9/2021 | Islam | H01L 25/0652 |
| 2021/0296220 A1* | 9/2021 | Hsu | H01L 25/18 |
| 2021/0305226 A1* | 9/2021 | Tsai | H01L 21/6835 |
| 2022/0115288 A1* | 4/2022 | Yen | H01L 21/6835 |

FOREIGN PATENT DOCUMENTS

| | | |
|---|---|---|
| KR | 20200028602 A | 3/2020 |
| WO | 2019066792 A1 | 4/2019 |

* cited by examiner

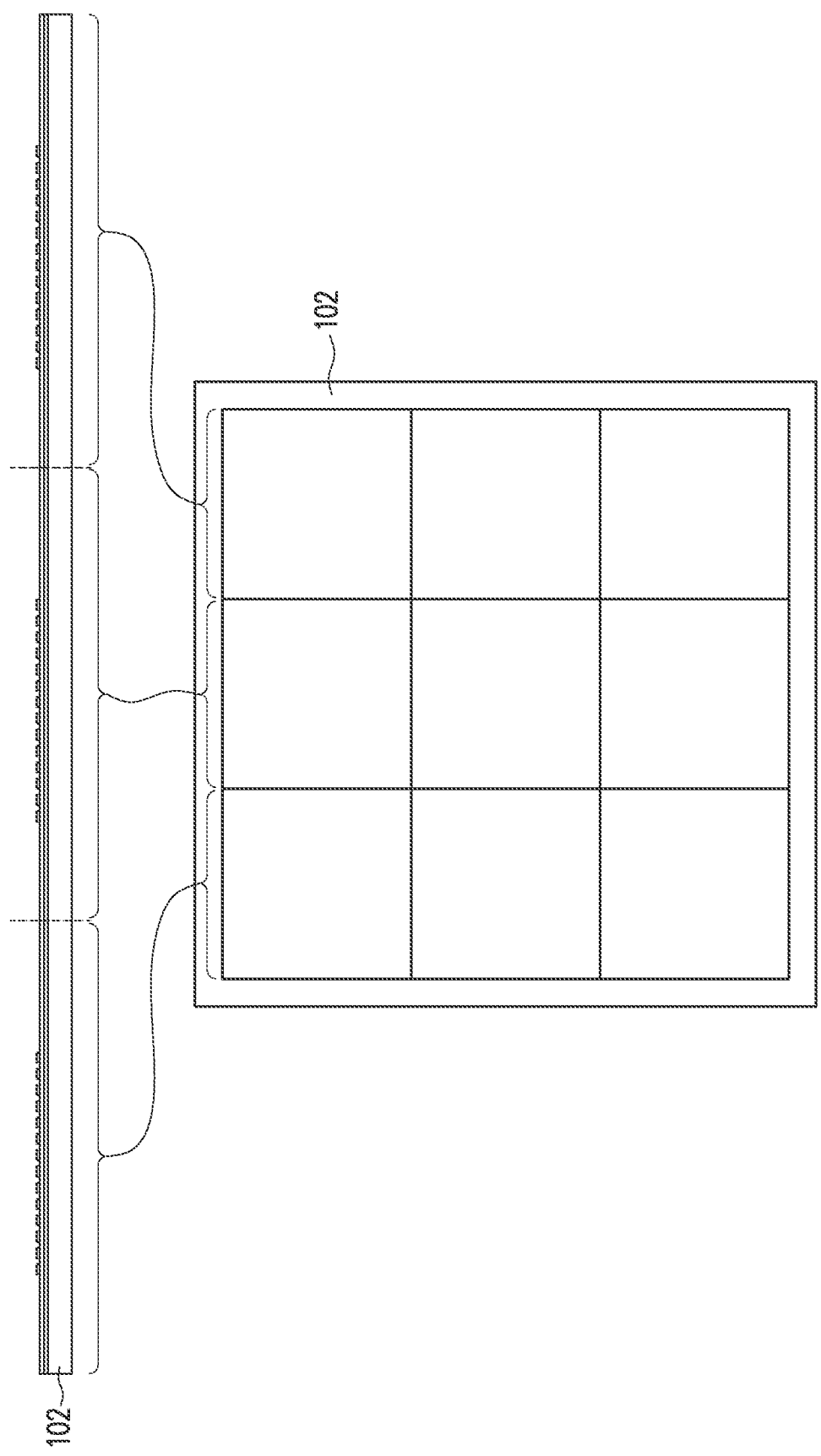

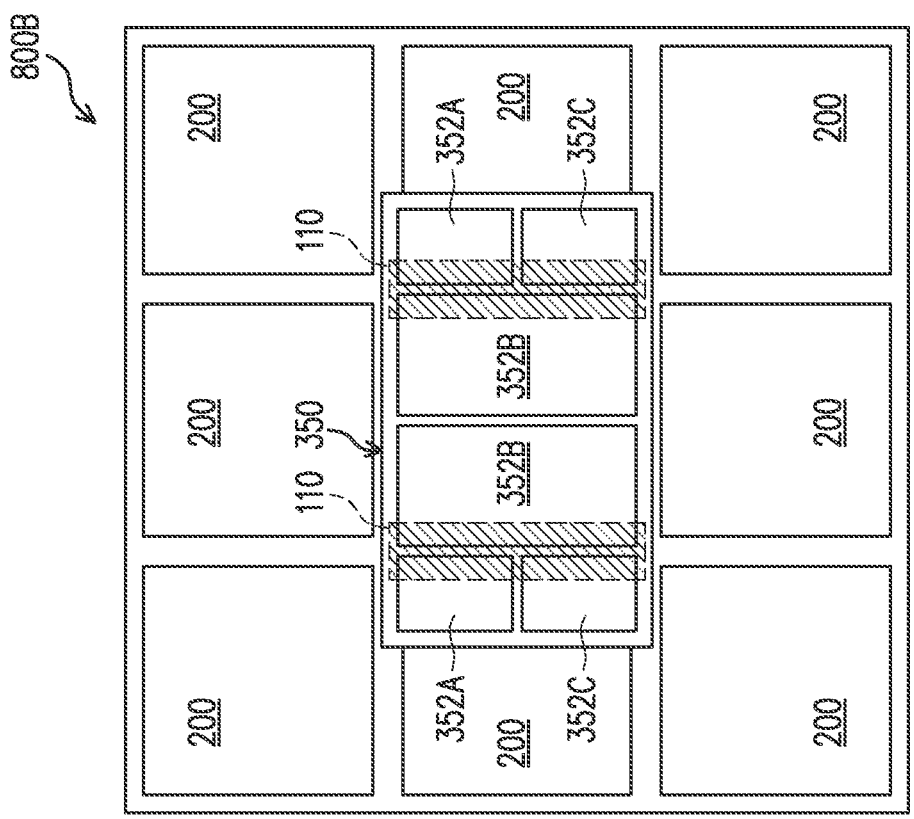
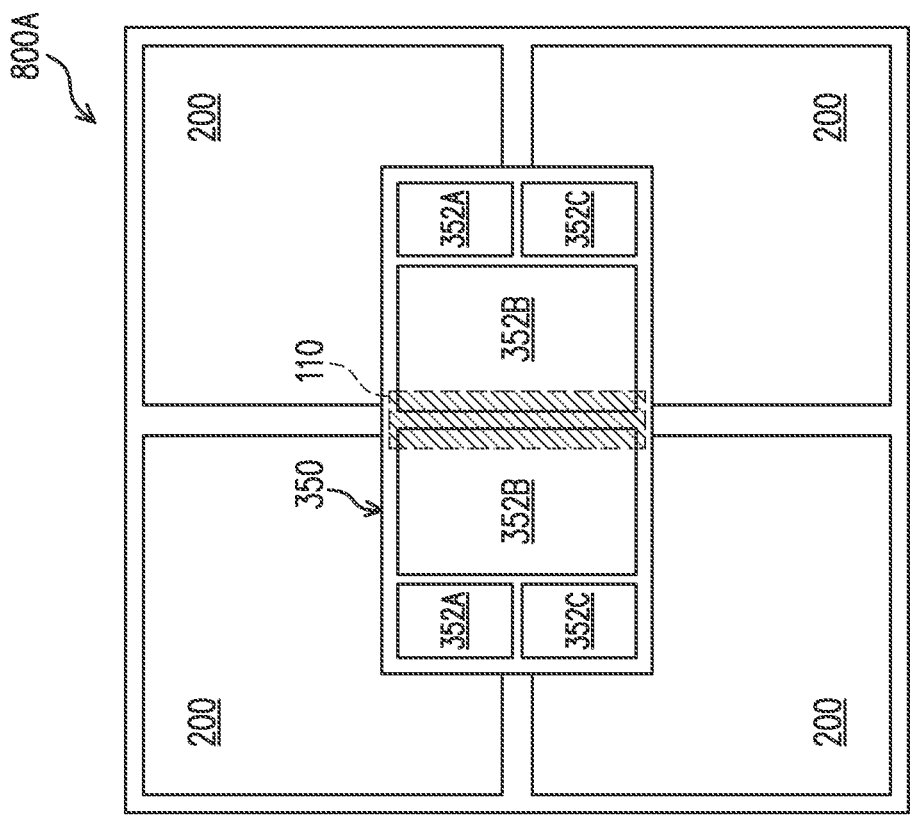
FIG. 30B
FIG. 30A

SEMICONDUCTOR DEVICE AND METHOD OF MANUFACTURE

PRIORITY CLAIM AND CROSS-REFERENCE

This application is a divisional application of U.S. patent application Ser. No. 17/097,206, entitled "Semiconductor Device and Method of Manufacture," and filed Nov. 13, 2020, which claims the benefit of U.S. Provisional Application No. 63/031,679, filed on May 29, 2020, which applications are hereby incorporated herein by reference in its entirety.

BACKGROUND

The semiconductor industry continues to improve the integration density of various electronic components (e.g., transistors, diodes, resistors, capacitors, etc.) by continual reductions in minimum feature size, which allow more components, hence more functions, to be integrated into a given area. Integrated circuits with high functionality require many input/output pads. Yet, small packages may be desired for applications where miniaturization is important.

As the demand for shrinking electronic devices has grown, a need for smaller and more creative packaging techniques of semiconductor dies has emerged. An example of such packaging systems is Package-on-Package (PoP) technology. In a PoP device, a top semiconductor package is stacked on top of a bottom semiconductor package to provide a high level of integration and component density. PoP technology generally enables production of semiconductor devices with enhanced functionalities and small footprints on a printed circuit board (PCB).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2B and 2C illustrate cross-sectional views of intermediate steps of forming structures on carrier substrates, in accordance with some embodiments.

FIGS. 27, 28, 29, 30A, 30B, and 30C illustrate cross-sectional views and plan views of package structures having internal supports, in accordance with some embodiments.

DETAILED DESCRIPTION

Figure 1:
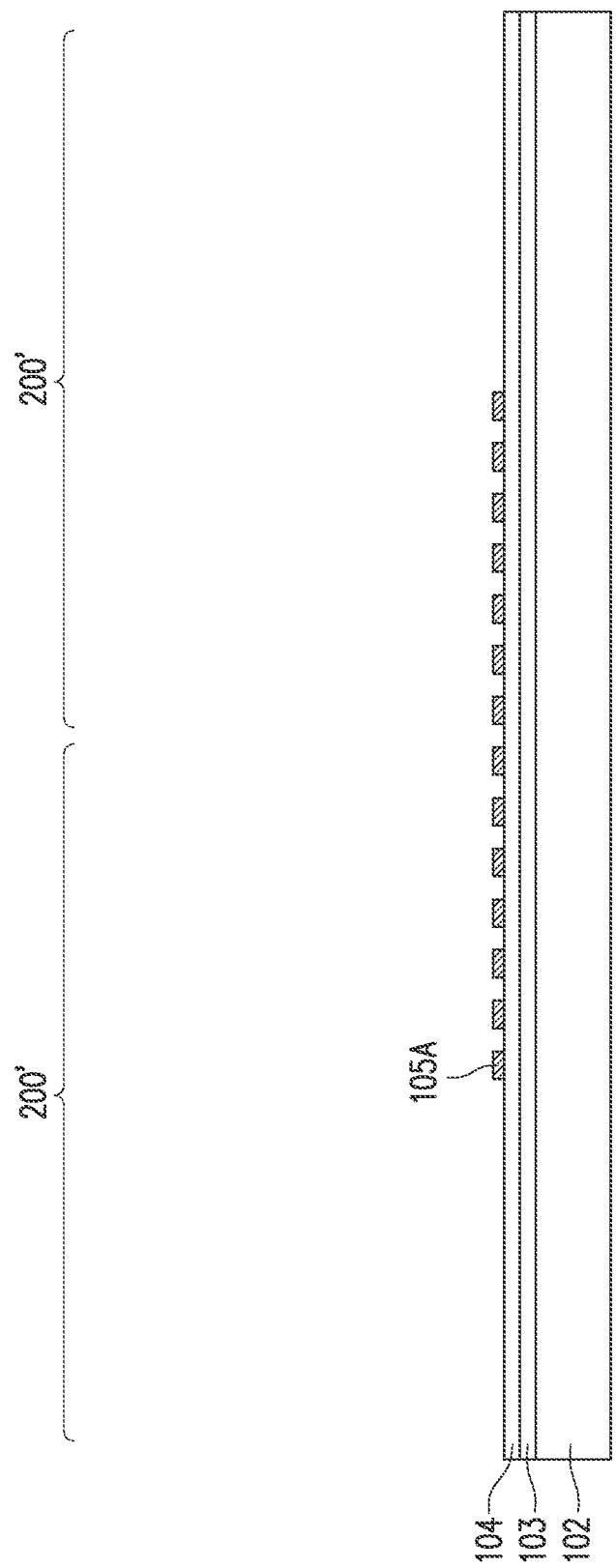
FIG. 1 illustrates a cross-sectional view of an intermediate step of forming first redistribution layers of a redistribution structure, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In this disclosure, various aspects of a package structure and the formation thereof are described. In some embodiments, one or more internal supports are incorporated within a redistribution structure of a package. The internal supports may be, for example, dummy dies or bulk materials. The internal supports may be placed to provide structural support to the package and reduce warping or cracking, particularly when multiple interconnects or integrated circuit dies are attached to the redistribution structure. Reducing stress within the package in this manner can improve performance and yield.

Figure 5:
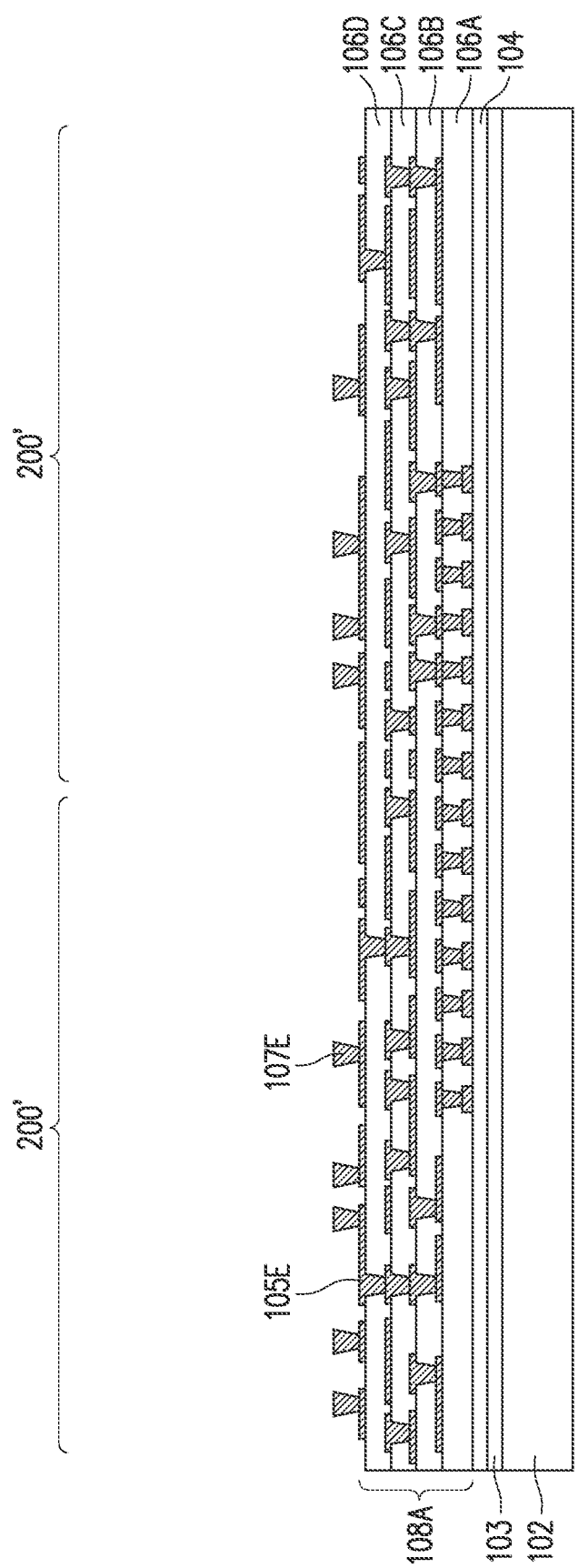
Figure 6:
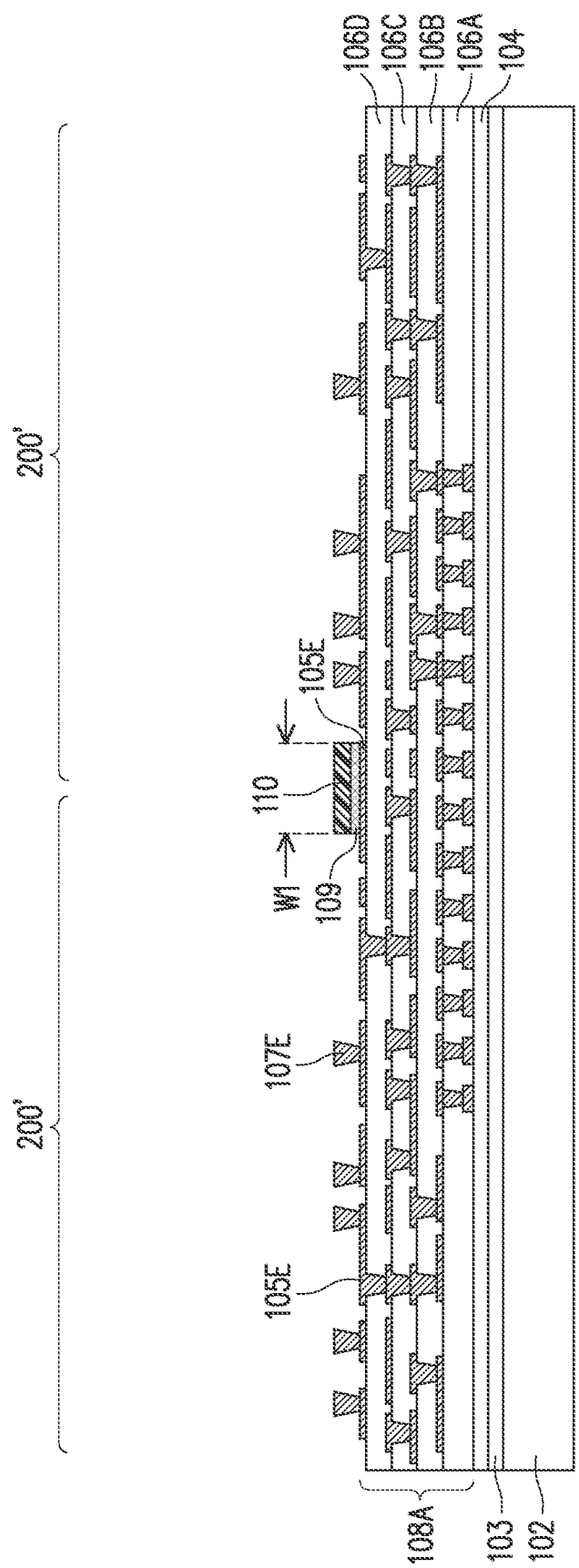
FIG. 6 illustrates a cross-sectional view of an intermediate step of forming an internal support in a redistribution structure, in accordance with some embodiments.
Figure 7:
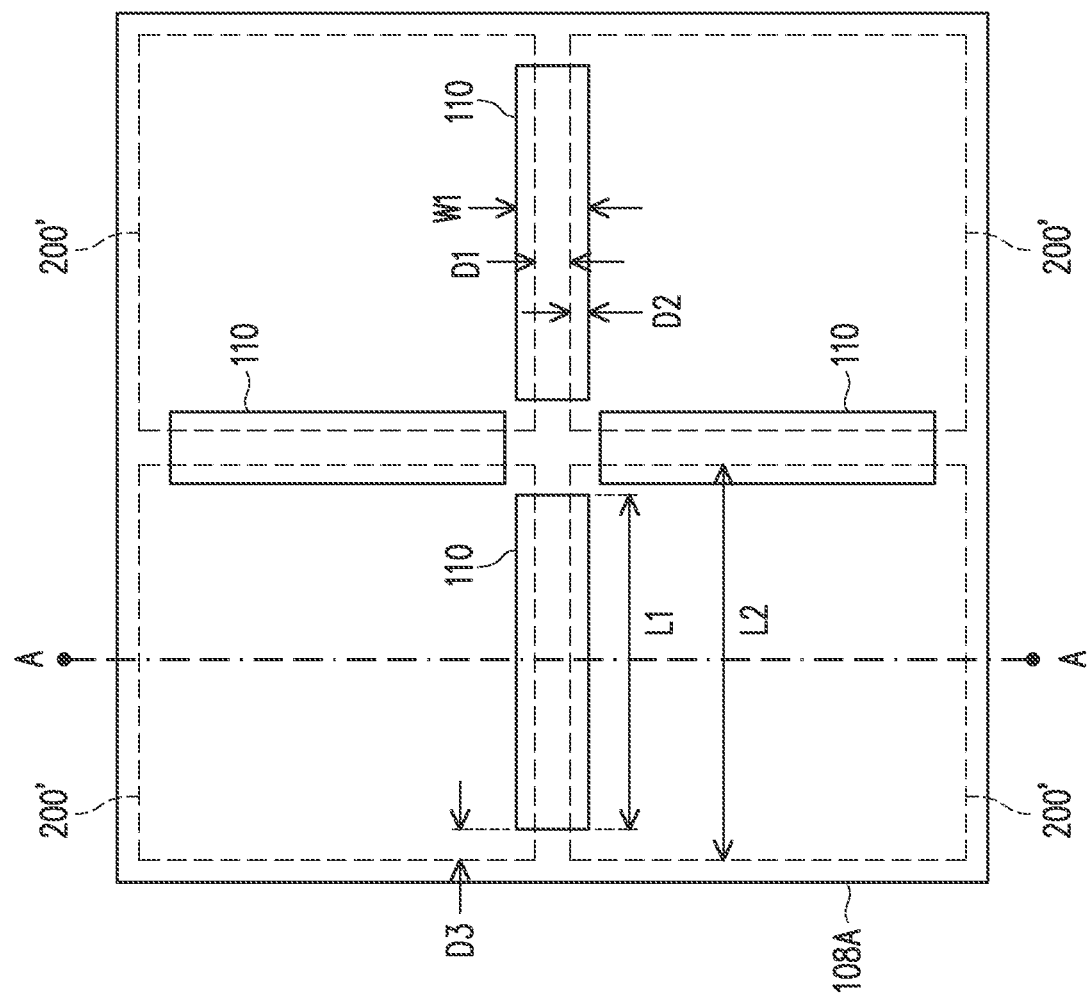
FIG. 7 illustrates a plan-sectional view of an intermediate step of forming an internal support in a redistribution structure, in accordance with some embodiments.

FIGS. 1 through 10 illustrate intermediate steps in the formation of a redistribution structure 100 (see FIG. 10), in accordance with some embodiments. The redistribution structure 100 includes one or more internal supports 110 (see FIGS. 6-7) that add structural stability and reduce warping. In subsequent steps, multiple interconnect structures 200 (see FIGS. 11-12) are attached to the redistribution structure 100. The interconnect regions 200' and 200' shown in FIGS. 1-10 indicate regions where the interconnect structures 200 are subsequently attached (see FIG. 11), and each interconnect region 200' has the same dimensions as the corresponding interconnect structure 200. FIGS. 2 and 7 illustrate plan views of the structure, and FIGS. 1, 3-6 and 8-10 illustrate cross-sectional views through the reference cross-section A-A shown in FIGS. 2 and 7.

FIGS. 1-4 illustrate the formation of first redistribution layers 108A of the redistribution structure 100, which includes multiple conductive lines 105A-E, multiple dielectric layers 106A-D, and multiple conductive vias 107A-D. The first redistribution layers 108A are shown as an illustrative example, and more or fewer conductive lines, dielectric layers, and/or conductive vias may be used in other embodiments. The first redistribution layers 108A may be formed using different materials and/or techniques than described below.

Figure 2A:
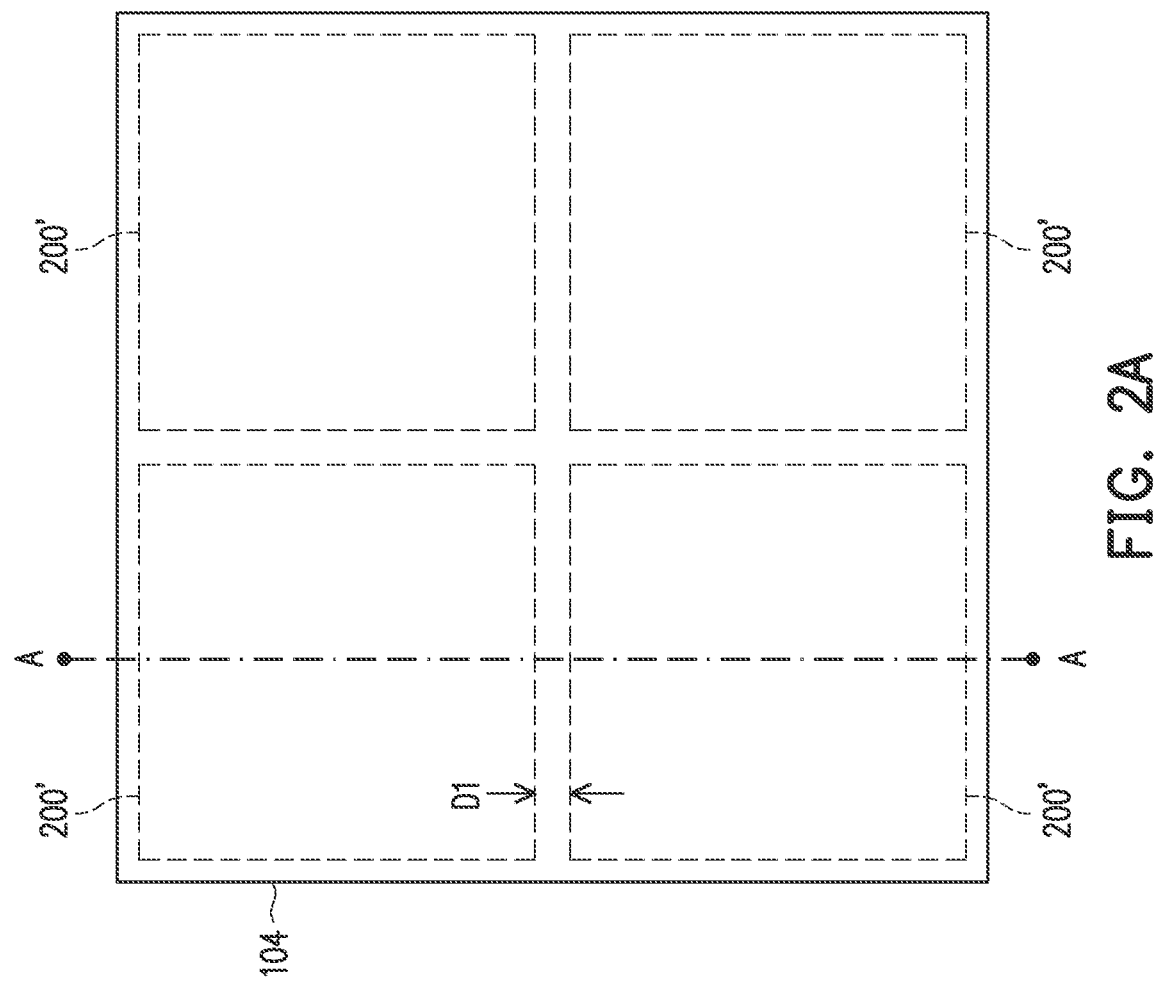
FIG. 2A illustrates a plan view of an intermediate step of forming first redistribution layers of a redistribution structure, in accordance with some embodiments.

Turning to FIG. 1, there is shown a first carrier substrate 102 on which a release layer 103, a protection layer 104, and conductive lines 105A have been formed, in accordance with some embodiments. FIG. 2A illustrates a plan view of the structure shown in FIG. 1, with the cross-section of FIG. 1 being through the reference cross-section A-A shown in FIG. 2A. Some of the features shown in FIG. 1, such as the conductive lines 105A, have been omitted from FIG. 2A for clarity reasons. FIG. 2A illustrates four interconnect regions 200', but in other embodiments more or fewer interconnect regions 200' may be present, the interconnect regions 200' may be different sizes or shapes than shown, or the interconnect regions 200' may have a different arrangement than shown. In some embodiments, adjacent interconnect regions 200' may be separated by a separation distance D1 in the range of about 40 μm to about 5000 μm, though other separation distances are possible.

The first carrier substrate 102 may include, for example, silicon-based materials, such as a silicon substrate (e.g., a silicon wafer), a glass material, silicon oxide, or other materials, such as aluminum oxide, the like, or a combination. In some embodiments, the first carrier substrate 102 may be a panel structure, which may be, for example, a supporting substrate formed from a suitable dielectric material, such as a glass material, a plastic material, or an organic material. The panel structure may be, for example, a rectangular panel.

Figure 2B:
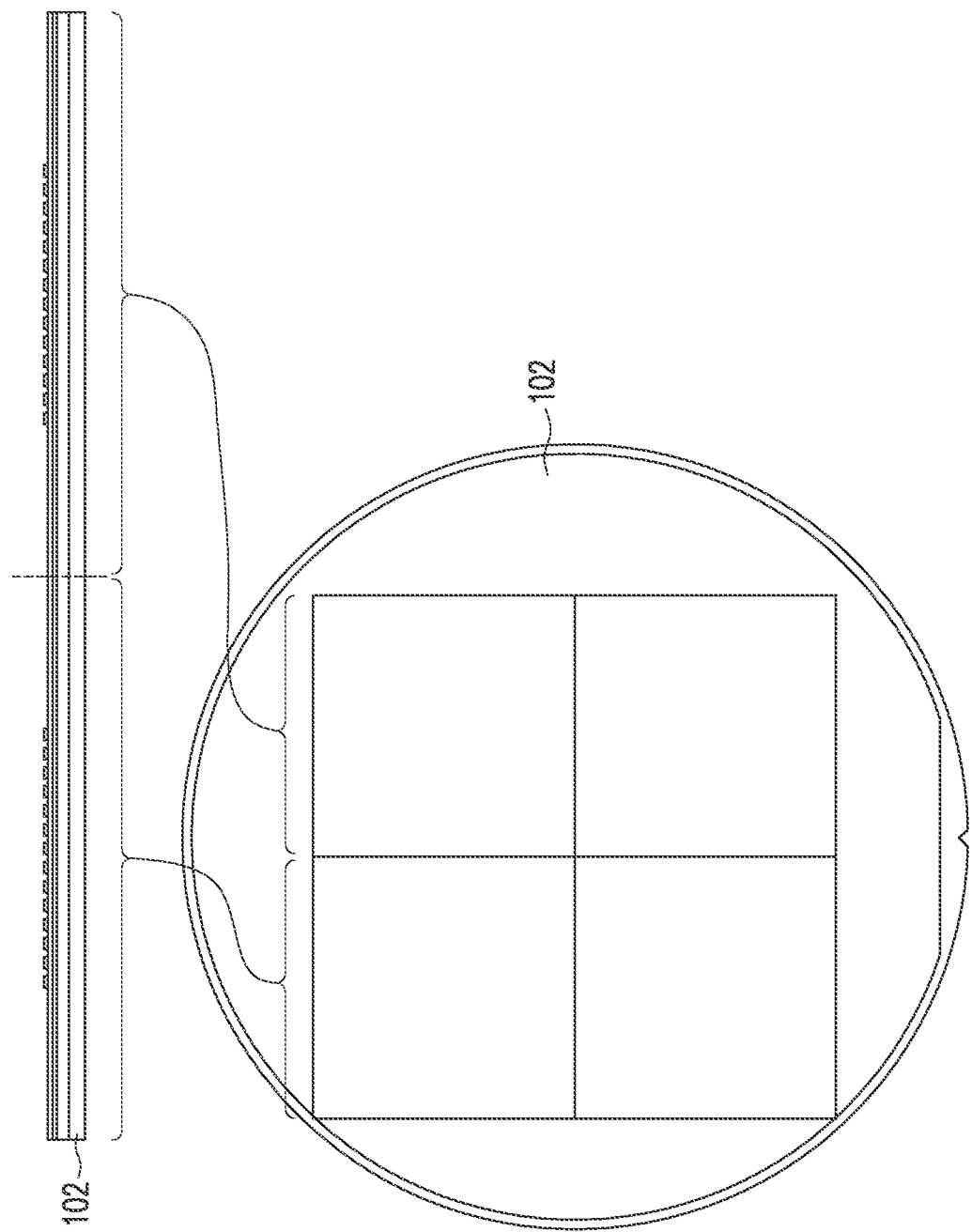

As illustrative examples, FIGS. 2B and 2C show different types of first carrier substrates 102, in accordance with some embodiments. FIG. 2B shows an embodiment in which the first carrier substrate 102 is a silicon wafer, and FIG. 2C shows an embodiment in which the first carrier substrate 102 is a panel structure. FIGS. 2B-C show multiple redistribution structures 100 formed on the first carrier substrates 102. In this manner, multiple structures may be formed simultaneously on a first carrier substrate 102. The structures formed on the first carrier substrate 102 may be subsequently singulated as part of a process of forming individual package structures 300 (see FIG. 18).

Returning to FIG. 1, a release layer 103 may be formed on the top surface of the first carrier substrate 102 to facilitate subsequent debonding of first carrier substrate 102. The release layer 103 may be formed of a polymer-based material, which may be removed along with the first carrier substrate 102 from the overlying structures that will be formed in subsequent steps. In some embodiments, the release layer 103 is an epoxy-based thermal-release material, which loses its adhesive property when heated, such as a light-to-heat-conversion (LTHC) release coating. In other embodiments, the release layer 103 may be an ultra-violet (UV) glue, which loses its adhesive property when exposed to UV lights. The release layer 103 may be dispensed as a liquid and cured, may be a laminate film laminated onto the first carrier substrate 102, or may be the like. The top surface of the release layer 103 may be leveled and may have a high degree of planarity. In some embodiments, a Die Attach Film (DAF) (not shown) may be used instead of or in addition to the release layer 103.

A protection layer 104 may be formed on the release layer 103, in some embodiments. The bottom surface of the protection layer 104 may be in contact with the top surface of the release layer 103. In some embodiments, the protection layer 104 is formed of a polymer, such as polybenzoxazole (PBO), polyimide, benzocyclobutene (BCB), or the like. In other embodiments, the protection layer 104 is formed of a nitride such as silicon nitride; an oxide such as silicon oxide, phosphosilicate glass (PSG), borosilicate glass (BSG), boron-doped phosphosilicate glass (BPSG), or the like; or the like. The protection layer 104 may be formed by any acceptable deposition process, such as spin coating, CVD, laminating, the like, or a combination thereof.

The conductive lines 105A of the redistribution structure 100 are formed on the protection layer 104. The conductive lines 105A may comprise, for example, conductive lines, redistribution layers or redistribution lines, contact pads, or other conductive features extending over a major surface of the protection layer 104. As an example to form the conductive lines 105A, a seed layer is formed over the protection layer 104. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, physical vapor deposition (PVD) or the like. A photoresist is then formed and patterned on the seed layer. The photoresist may be formed by spin coating or the like and may be exposed to light for patterning, in which the pattern of the photoresist corresponds to the conductive lines 105A. The patterning forms openings through the photoresist to expose the seed layer, and then a conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, the like, or combinations thereof. Then, the photoresist and portions of the seed layer on which the conductive material is not formed are removed. The photoresist may be removed by an acceptable ashing or stripping process, such as using an oxygen plasma, a chemical stripping process, or the like. Once the photoresist is removed, exposed portions of the seed layer are removed, such as by using an acceptable etching process, such as by wet or dry etching. The remaining portions of the seed layer and conductive material form the conductive lines 105A. Other techniques of forming the conductive lines 105A are possible.

Figure 3:
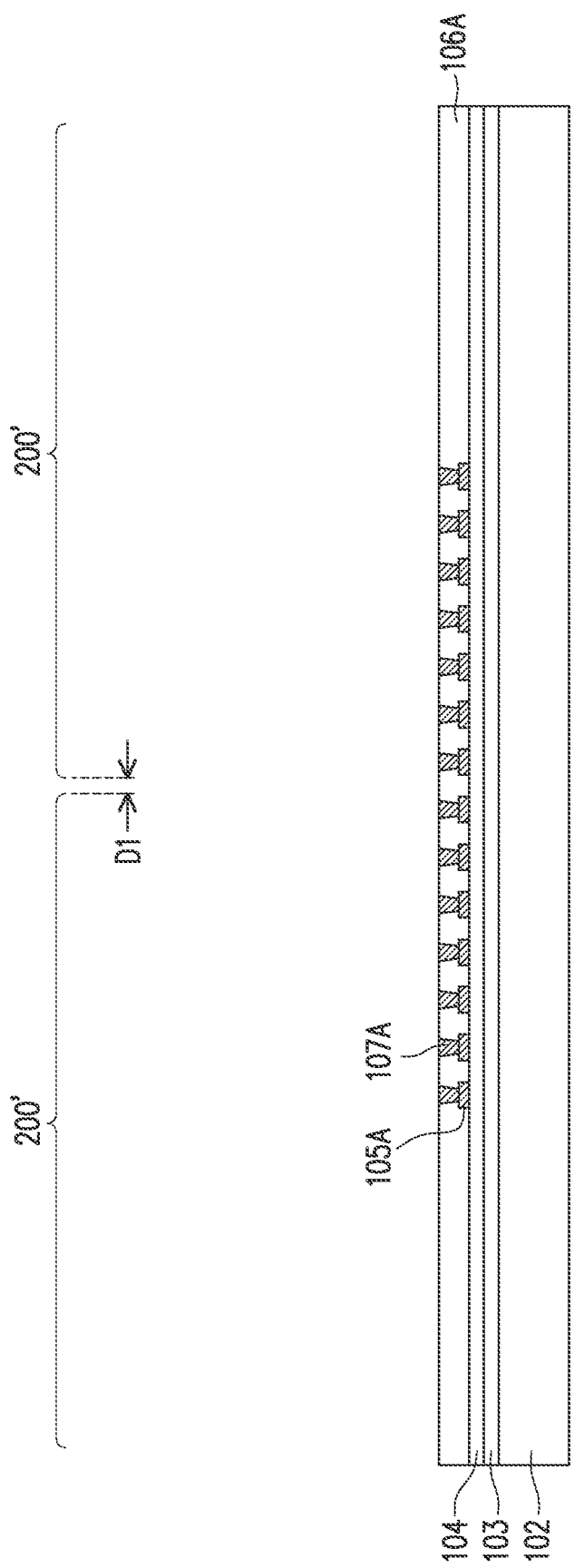
FIGS. 3, 4, and 5 illustrate cross-sectional views of intermediate steps of forming first redistribution layers of a redistribution structure, in accordance with some embodiments.

In FIG. 3, conductive vias 107A are formed over the conductive lines 105A, in accordance with some embodiments. The conductive vias 107A extend on the conductive lines 105A and make electrical connections between the conductive lines 105A and subsequently formed conductive lines 105B of the redistribution structure 100. As an example to form the conductive vias 107A, a photoresist is formed and patterned over the protection layer 104 and the conductive lines 105A. The photoresist may be formed by spin coating or the like and may be exposed to light for patterning. The patterning of the photoresist forms openings through the photoresist to expose portions of the underlying conductive lines 105A such that the openings in the photoresist correspond to the pattern of the conductive vias 107A. A conductive material is then formed in the openings of the photoresist and on the exposed portions of the conductive lines 105A. The conductive material may be formed by plating, such as electroplating or electroless plating, or the like. The conductive material may comprise a metal, like copper, titanium, tungsten, aluminum, the like, or combinations thereof. The photoresist may be removed by an acceptable ashing or stripping process. Together, the conductive lines 105A and the conductive vias 107A form a metallization pattern of the redistribution structure 100.

After forming the conductive vias 107A, a dielectric layer 106A is formed on and around the conductive vias 107A and the conductive lines 105A, in accordance with some embodiments. After formation, the dielectric layer 106A surrounds the conductive vias 107A and the conductive lines 105A. The dielectric layer 106A and metallization pattern, including the conductive vias 107A and the conductive lines 105A, form one of the first redistribution layers 108A of the redistribution structure 100. In some embodiments, the dielectric layer 106 is an encapsulant, such as a pre-preg, resin, resin coated copper (RCC), molding compound, polyimide, photo-imageable dielectric (PID), epoxy, or the like, and may be applied by a suitable technique such as compression molding, transfer molding, or the like. The encapsulant may be applied in liquid or semi-liquid form and then subsequently cured. In some embodiments, the dielectric layer 106A is formed such that the conductive lines 105A and the conductive vias 107A are buried or covered, and a planarization process is then performed on the dielectric layer 106A to expose the conductive vias 107A. The topmost surfaces of the dielectric layer 106A and the conductive vias 107A may be substantially level (e.g., planar) after the planarization process, within process variations. The planarization process may include, for example, a grinding process and/or a chemical-mechanical polish (CMP) process. In some embodiments, the dielectric layer 106A may comprise other materials, such as silicon oxide, silicon nitride, or the like. In some embodiments, the dielectric layer 106A is formed having a thickness in the range of about 5 μm to about 50 μm, though other thicknesses are possible.

Figure 4:
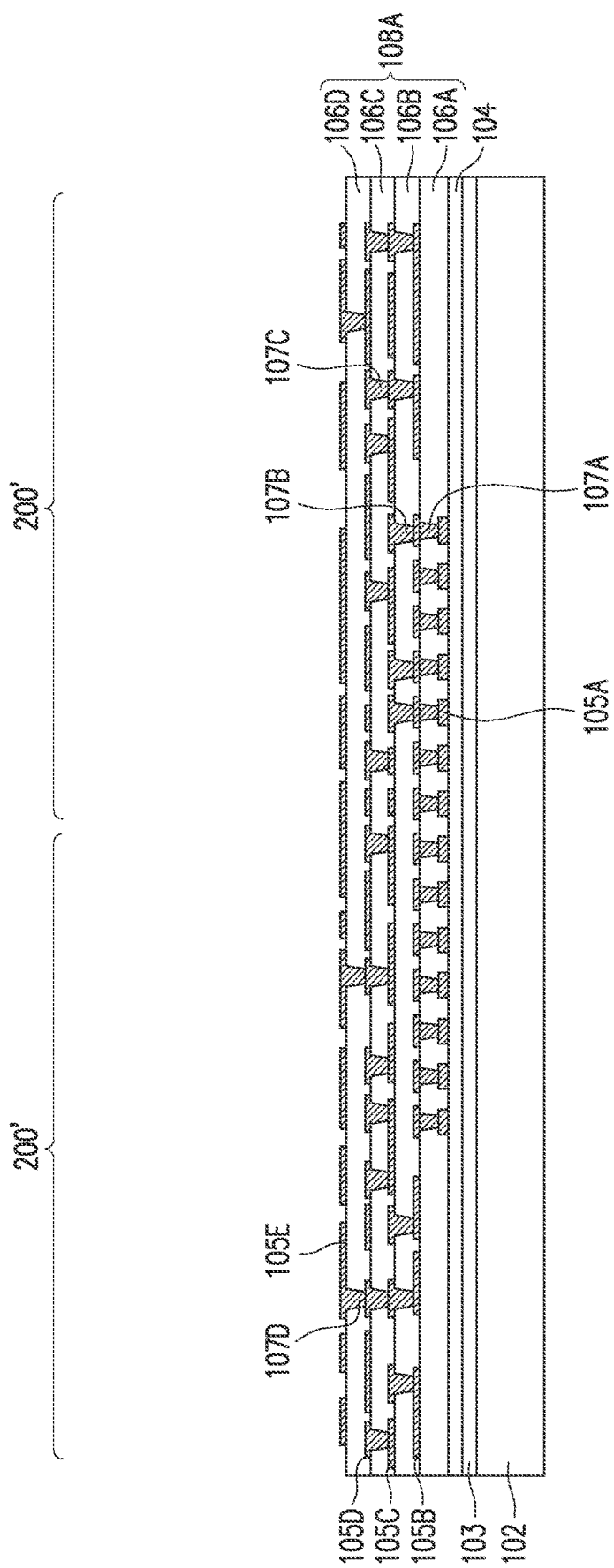

In FIG. 4, the steps and process discussed above are repeated to form additional redistribution layers of the first redistribution layers 108A, in accordance with some embodiments. The first redistribution layers 108A shown in FIG. 4 include additional dielectric layers 106B, 106C, and 106D; additional conductive lines 105B, 105C, 105D, and 105E; and additional conductive vias 107B, 107C, and 107D. The first redistribution layers 108A are shown as an example of redistribution layers comprising five layers of conductive lines, but more or fewer layers dielectric layers, conductive lines, or conductive vias may be formed in the first redistribution layers 108A. If fewer redistribution layers are to be formed, some steps and processes discussed below may be omitted. If more redistribution layers are to be formed, some steps and processes discussed below may be repeated.

The additional redistribution layers of the first redistribution layers 108A may be formed using similar techniques as described for the dielectric layer 106A, conductive lines 105A, and conductive vias 107A. For example, conductive lines 105B may be formed on the dielectric layer 106A and the conductive vias 107A. The conductive lines 105B make physical and electrical contact with underlying conductive vias 107A. The conductive lines 105B may be formed in a similar manner and of similar materials as the conductive lines 105A. Conductive vias 107B may then be formed on the conductive lines 105B, and may be formed in a similar manner and of similar materials as the conductive vias 107A. Dielectric layer 106B may then be formed over the dielectric layer 106A, the conductive lines 105B, and the conductive vias 107B. The dielectric layer 106B may be formed in a similar manner and of similar material as the dielectric layer 106A. A planarization process may be performed on the dielectric layer 106B to expose the conductive vias 107B. Steps or processes similar to these may be performed to form the conductive lines 105B, 105C, 105D, and 105E; conductive vias 107C and 107D; and dielectric layers 106C and 106D. In some embodiments, the conductive lines and/or conductive vias may be formed having different sizes. For example, one or more of the conductive lines or conductive vias may have a different width, pitch, or thickness than other conductive lines or conductive vias. In some embodiments, one or more of the dielectric layers may be formed from different materials or have different thicknesses than other dielectric layers.

Although one process for forming the conductive vias 107A-D, dielectric layers 106A-D, and conductive lines 105A-E has been described, it should be appreciated that other processes may be used to form the first redistribution layers 108A. For example, the conductive vias and the conductive lines of a redistribution layer may be formed simultaneously, by forming a single metallization pattern comprising via portions corresponding to the conductive vias and line portions corresponding to the conductive lines. In such embodiments, the line portions of the metallization pattern are on and extend along the major surface of a dielectric layer, and the via portions of the metallization pattern extend through the dielectric layer to physically and electrically couple the conductive lines to underlying conductive features. In such embodiments, no seed layers are formed between the conductive vias and conductive lines of the same redistribution layer.

FIGS. 5 through 10 illustrate intermediate steps in the formation of second redistribution layers 108B (see FIG. 10) of the redistribution structure 100, including the incorporation of internal supports 110 (see FIG. 6), in accordance with some embodiments. In FIG. 5, conductive vias 107E of the second redistribution layers 108B are formed on the conductive lines 105E, and may be formed in a similar manner and of similar materials as the conductive vias 107A-D. The conductive vias 107E are formed on the conductive lines 105E to make physical and electrical contact with the conductive lines 105E.

In FIG. 6, one or more internal supports 110 are attached to the first redistribution layers 108A. The internal supports 110 are passive structures incorporated within the redistribution structure 100 to provide additional structural support to the redistribution structure 100. The internal supports 110 may be free of passive and/or active devices. The stability provided by the internal supports 110 can reduce stress, warping, or cracking of the redistribution structure 100 during or after bonding to multiple interconnect structures 200 (see FIG. 11). In some cases, the internal supports 110 may be considered "dummy structures" or "dummy die" within the redistribution structure 100. In some embodiments, the internal supports 110 have a thickness that is in the range of about 15 μm to about 100 μm, although other thicknesses are possible. In some cases, the thickness of the internal supports 110 are chosen to provide sufficient structural support while adding little or no thickness to the overall redistribution structure 100.

The internal supports 110 may be formed of a material that has a suitable mechanical stiffness or rigidity. In some embodiments, the internal supports 110 may be formed from a semiconductor material such as silicon, silicon carbide, gallium arsenide, gallium phosphide, indium phosphide, indium arsenide, indium antimonide, the like, or combinations thereof. In some embodiments, the internal supports 110 may be formed from a dielectric material such as a ceramic material, quartz, another electrically inert material, the like, or combinations thereof. In some embodiments, the internal supports 110 may be a metal or metal alloy, such as a tin-nickel alloy (e.g., "Alloy 42") or the like. In some embodiments, the internal supports 110 are formed from two or more different materials, such as multiple layers of different materials. In some embodiments, the material of the internal supports 110 is chosen based on the mechanical stiffness or rigidity of the material. For example, in some embodiments the material for the internal supports 110 may be chosen to have a Young's modulus that is in the range of about 10 Gpa to about 160 GPa, although other values are possible. In some embodiments, the material for the internal supports 110 is chosen based on the Coefficient of Thermal Expansion (CTE) of the redistribution structure 100. For example, a particular material for the internal supports 110 may be chosen that has a CTE similar to that of the redistribution structure 100 or features therein. In some embodiments, the material for the internal supports may be chosen to have a CTE that is in the range of about 2 ppm to about 10 ppm, although other values are possible.

FIG. 6 illustrates an internal support 110 that is attached to the exposed conductive lines (e.g., conductive lines 105E) of the first redistribution layers 108A, but in other embodiments the internal supports 110 may be attached to the exposed dielectric layer (e.g., dielectric layer 106D) of the first redistribution layers 108A. An adhesive 109 on the internal supports 110 adheres the internal supports 110 to the first redistribution layers 108A (e.g., to the conductive lines 105E or the dielectric layer 106D). The adhesive 109 may be any suitable adhesive, epoxy, adhesive film, Die Attach Film (DAF), or the like. The adhesive 109 may be applied to the internal supports 110 or may be applied over the surface of the first redistribution layers 108A. In some embodiments, the adhesive 109 has a thickness that is in the range of about 2 μm to about 20 μm, such as 3 μm, though other thicknesses are possible. The internal supports 110 may be placed using a pick-and-place technique or the like.

In some embodiments, the internal supports 110 are placed on the structure to laterally overlap two or more interconnect regions 200' where interconnect structures 200 (see FIG. 11) are subsequently attached. The internal support 110 shown in FIG. 6 is approximately laterally centered between adjacent interconnect regions 200' such that the internal support 110 laterally overlaps portions of both of the adjacent interconnect regions 200'. In some cases, laterally positioning internal supports 110 between and/or overlapping multiple interconnect structures 200 can reduce stress within the redistribution structure 100 due to the multiple interconnect structures 200 being attached to the redistribution structure 100, which can reduce warping or cracking of the redistribution structure 100.

Turning to FIG. 7, an illustrative plan view of a structure similar to that of FIG. 6 is shown, in accordance with some embodiments. The example cross-section A-A shown in FIG. 7 corresponds to the cross-sectional view shown in FIG. 6. For example, the internal supports 110 shown in FIG. 7 may be similar to the internal support 110 shown in FIG. 6. The plan view of FIG. 7 is an illustrative example, and some features shown in FIG. 6 (such as the conductive lines 105E and conductive vias 107E) are not shown in FIG. 7 for clarity reasons. FIG. 7 illustrates the first redistribution layers 108A with four interconnect regions 200'. Four internal supports 110 are attached to the first redistribution layers 108A and laterally overlap adjacent pairs of interconnect regions 200'. In this manner, each adjacent pair of interconnect regions 200' has a corresponding internal support 110 that can reduce stress in the redistribution structure 100 after the interconnect structures 200 are attached (see FIG. 13). FIG. 7 shows four internal supports 110, but in other embodiments more or fewer internal supports 110 may be used. In some embodiments, each adjacent pair of interconnect regions may have two or more corresponding internal supports 110 that overlap each of the interconnect regions 200' in the adjacent pair. In some embodiments, different internal supports 110 attached to the first redistribution layers 108A may have different sizes or shapes. For some examples of structures with multiple internal supports 110, see the embodiments described below for FIGS. 27-30B.

Still referring to FIG. 7, in some embodiments the internal supports 110 may have a width W1 in the range of about 80 μm to about 6000 μm, though other widths are possible. In some embodiments, an overlap distance D2 between an edge of an internal support 110 and an edge of an interconnect region 200' is in the range of about 20 μm to about 500 μm, though other overlap distances are possible. In some cases, a greater overlap distance D2 may provide more structural support for the redistribution structure 100. In some embodiments, an internal support 110 may have a length L1 that is in the range of about 2 mm to about 60 mm, though other lengths are possible. In some embodiments, an interconnect region 200' may have a length L2 that is in the range of about 15 mm to about 70 mm, though other lengths are possible. An internal support 110 may have a length L1 that is in the range of about 2.5% to about 86% of the length L2 of an interconnect region 200'. In some cases, an internal support 110 having a greater length L1 may provide more structural support to the redistribution structure 100. In some embodiments, the separation distance D3 between an end of an internal support 110 and an edge of an interconnect region 200' may be in the range of about 20 μm to about 500 μm, though other separation distances are possible. An internal support 110 may be approximately laterally centered with an interconnect region 200' such that the separation distance D3 of both ends of the internal support 110 are about the same, or an internal support 110 may be laterally offset such that the separation distance D3 of one end of the internal support 110 is different from the separation distance D3 of the other end of the internal support 110.

Figure 8:
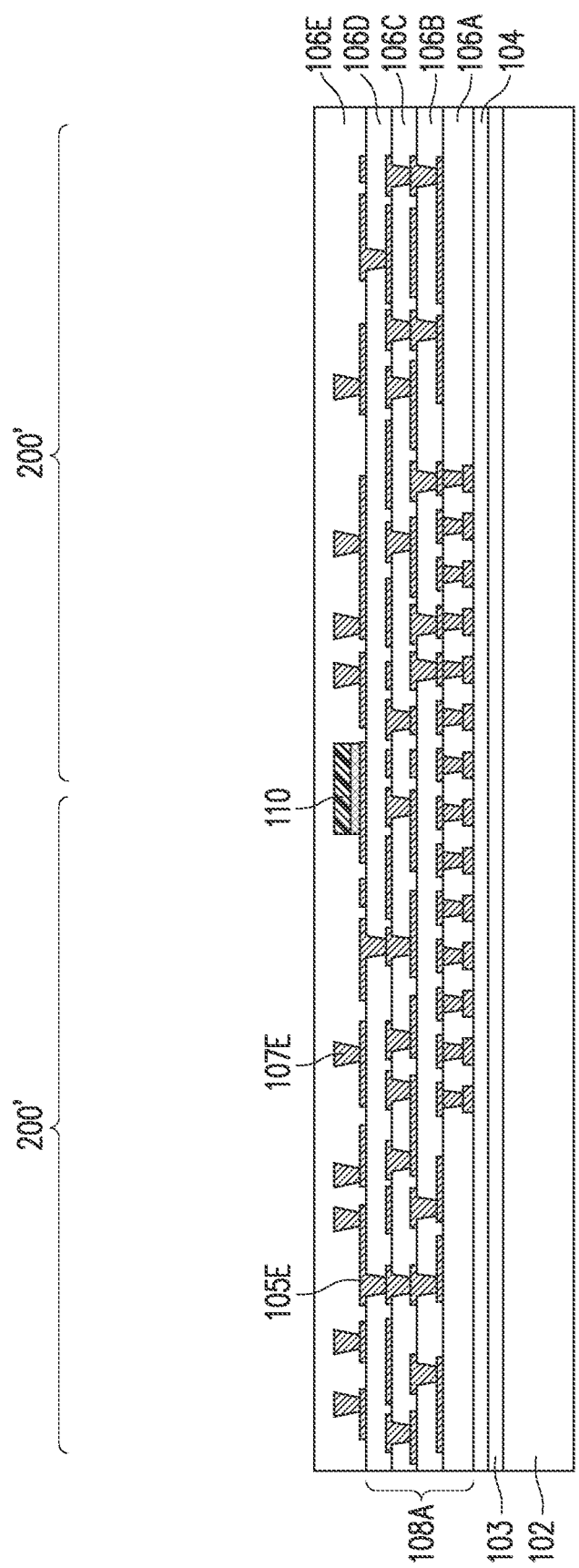
FIGS. 8, 9, and 10 illustrate cross-sectional views of intermediate steps of forming second redistribution layers of a redistribution structure, in accordance with some embodiments.
Figure 9:
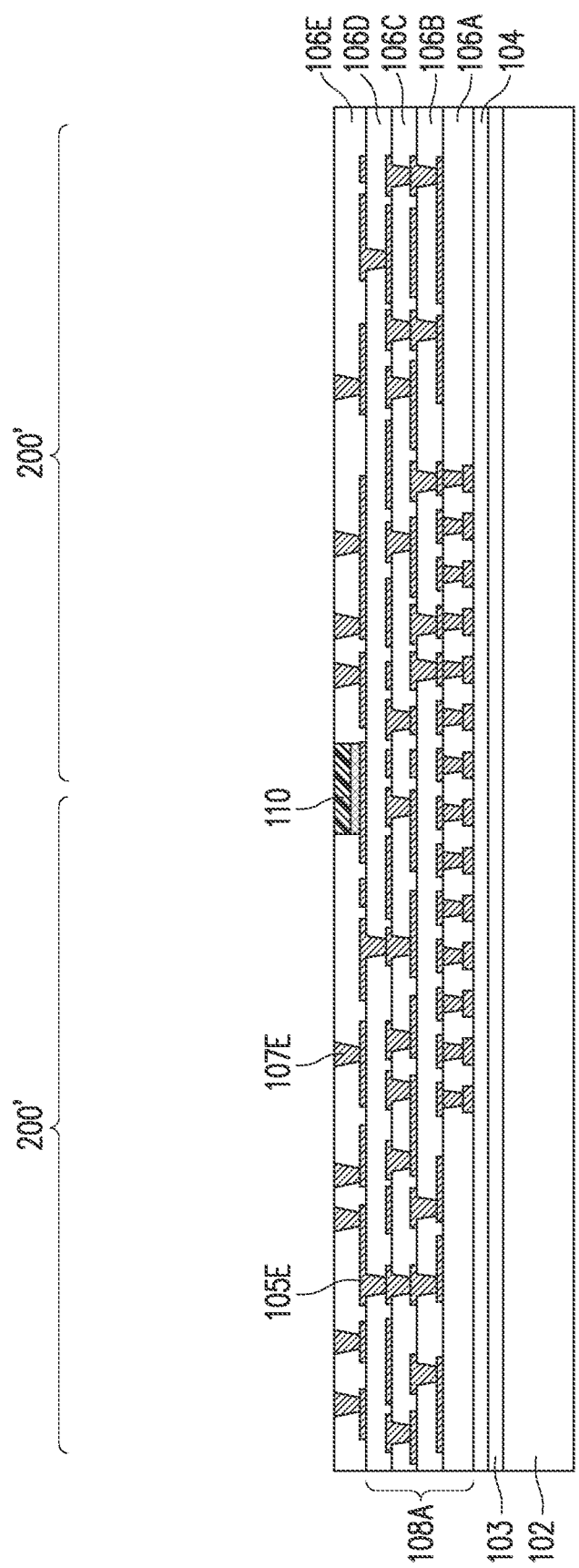

In FIG. 8, a dielectric layer 106E of the second redistribution layers 108B is formed over the internal supports 110, the dielectric layer 106D, the conductive lines 105E, and the conductive vias 107B. The dielectric layer 106E may be formed in a similar manner and of similar material as the dielectric layers 106A-D, though the dielectric 106E may be a different material than one or more of the dielectric layers 106A-D. In FIG. 9, a planarization process such as a CMP process and/or a mechanical grinding process is performed on the dielectric layer 106E, the conductive vias 107E, and/or the internal supports 110. The planarization process exposes the conductive vias 107E. In some embodiments, the planarization process exposes the dielectric layer 106E, the conductive vias 107E, and the internal supports 110, and top surfaces of the dielectric layer 106E, the conductive vias 107E, and the internal support 110 may be level. In other embodiments, the dielectric layer 106E remains covering the internal supports 110 after performing the planarization process.

Figure 10:
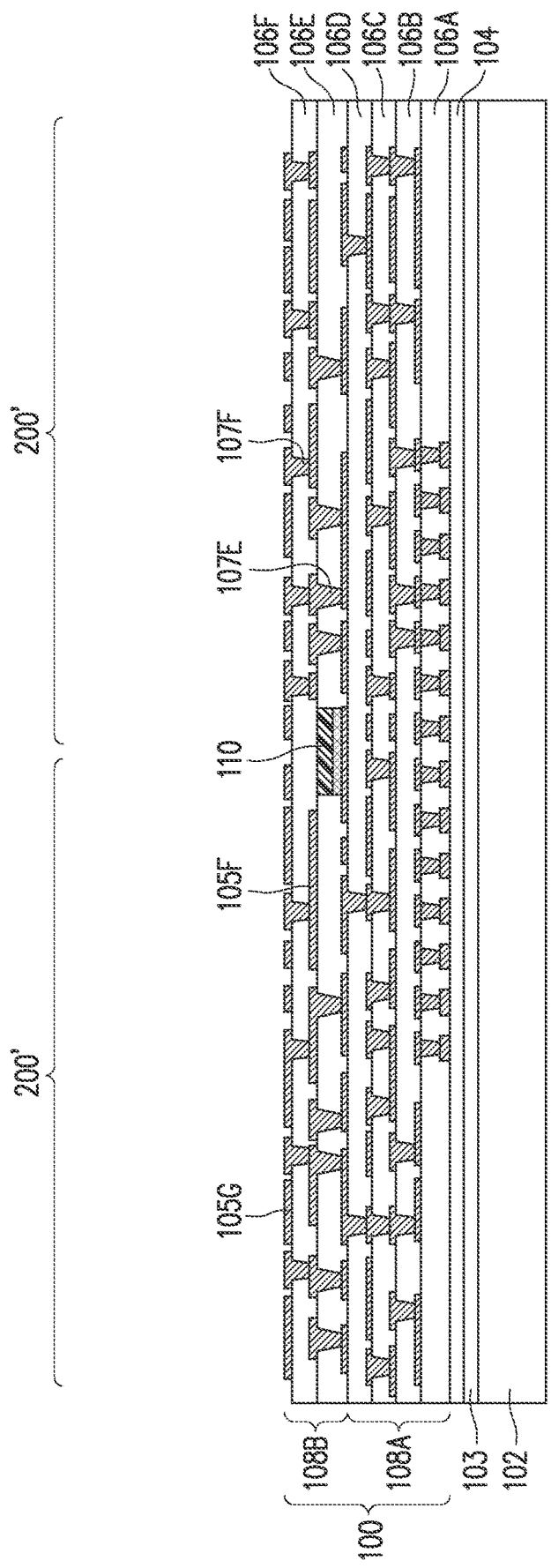

In FIG. 10, the dielectric layer 106F, conductive vias 107F, and conductive lines 105F-G of the second redistribution layers 108B are formed over the dielectric layer 106E. In this manner, the redistribution structure 100 is formed of the first redistribution layers 108A and the second redistribution layers 108B with one or more internal supports 110 disposed between the first redistribution layers 108A and the second redistribution layers 108B. In other embodiments, the first redistribution layers 108A or the second redistribution layers 108B may have a different number of conductive lines, conductive vias, or dielectric layers than shown. In this manner, the redistribution structure 100 may have any suitable number of redistribution layers (e.g., conductive vias, conductive lines, and/or dielectric layers), and internal supports 110 may be located within any suitable dielectric layer(s) of the redistribution structure 100. If fewer redistribution layers of the second redistribution layers 108B are to be formed, some steps and processes discussed below may be omitted. If more redistribution layers are to be formed, some steps and processes discussed below may be repeated.

The dielectric layer 106F, the conductive vias 107F, and the conductive lines 105F-G of the second redistribution layers 108B may be formed using similar materials and using similar techniques as described for the first redistribution layers 108A. For example, conductive lines 105F may be formed on the dielectric layer 106E and the conductive vias 107E. The conductive lines 105F make physical and electrical contact with underlying conductive vias 107E. The conductive lines 105F may be formed in a similar manner and of similar materials as the conductive lines 105A-E. Conductive vias 107F may then be formed on the conductive lines 105F, and may be formed in a similar manner and of similar materials as the conductive vias 107A-E. Dielectric layer 106F may then be formed over the dielectric layer 106E, the conductive lines 105F, and the conductive vias 107F. The dielectric layer 106F may be formed in a similar manner and of similar material as the dielectric layers 106A-E. A planarization process may be performed on the dielectric layer 106F to expose the conductive vias 107F. Steps or processes similar to these may be performed to form the conductive lines 105G. In some embodiments, the conductive lines and/or conductive vias may be formed having different sizes. For example, one or more of the conductive lines or conductive vias may have a different width, pitch, or thickness than other conductive lines or conductive vias. In some embodiments, one or more of the dielectric layers may be formed from different materials or have different thicknesses than other dielectric layers.

In some embodiments, under-bump metallization structures (UBMs, not shown) are formed on the topmost conductive lines (e.g., conductive lines 105G) of the redistribution structure 100. The UBMs may, for example, include three layers of conductive materials, such as a layer of titanium, a layer of copper, and a layer of nickel. However, other arrangements of materials and layers may be used, such as an arrangement of chrome/chrome-copper alloy/ copper/gold, an arrangement of titanium/titanium tungsten/ copper, or an arrangement of copper/nickel/gold, that are suitable for the formation of the UBMs. Any suitable materials or layers of material that may be used for the UBMs and are fully intended to be included within the scope of the current application. The UBMs may be created by forming each layer of the UBMs over the redistribution structure 100. The forming of each layer may be performed using a plating process, such as electroplating or electroless plating, although other processes of formation, such as sputtering, evaporation, or PECVD process, may alternatively be used depending upon the desired materials. Once the desired layers have been formed, portions of the layers may then be removed through a suitable photolithographic masking and etching process to remove the undesired material and to leave the UBMs in a desired shape, such as a circular, octagonal, square, or rectangular shape, although any desired shape may alternatively be formed. In some embodiments, the UBMs are formed over the topmost redistribution layer as part of formation of the redistribution structure 100, which may include using the same photolithographic steps used to form the topmost redistribution layer of the redistribution structure 100. For example, layers of the UBMs may be deposited over the topmost redistribution layer, and then excess material of the topmost redistribution layer and the UBMs removed in the same process. In some embodiments, the UBMs may be part of the topmost redistribution layer of the redistribution structure 100 and may, for example, extend through the topmost dielectric layer of the redistribution structure 100 (e.g., dielectric layer 106F).

Figure 11:
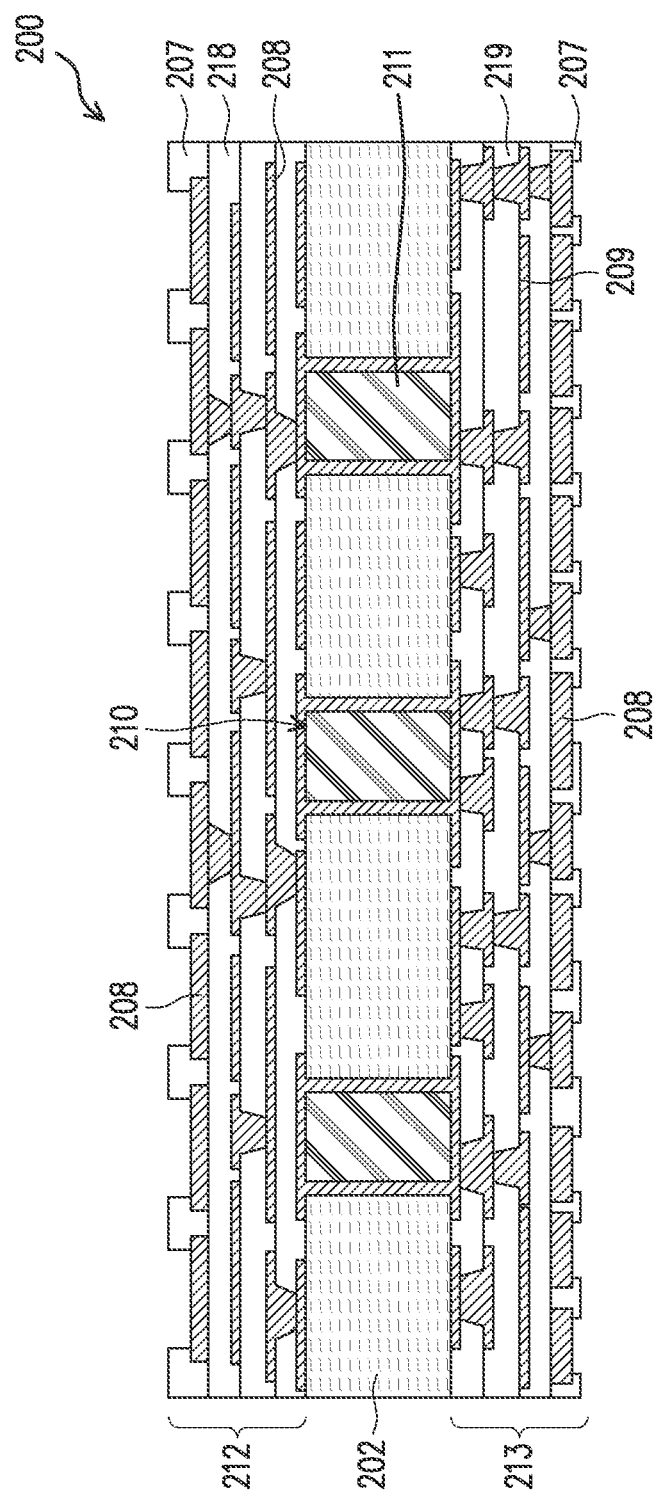
FIG. 11 illustrates a cross-sectional view of an interconnect structure, in accordance with some embodiments.

FIG. 11 illustrates an interconnect structure 200, in accordance with some embodiments. The interconnect structure 200 is subsequently bonded to the redistribution structure 100 to form a package structure 300 (see FIG. 18) and provides additional routing and stability to the redistribution structure 100. For example, the interconnect structure 200 can reduce warping of the redistribution structure 100. In some embodiments, the interconnect structure 200 may be, for example, an interposer or a "semi-finished substrate," and may be free of active devices. The interconnect structure 200 may have a thickness between about 200 µm and about 3000 µm, though other thicknesses are possible.

In some embodiments, interconnect structure 200 may include routing layers (e.g., routing structures 212 and 213) formed on a core substrate 202. The core substrate 202 may include a material such as Ajinomoto build-up film (ABF), a pre-impregnated composite fiber ("prepreg") material, an epoxy, a molding compound, an epoxy molding compound, fiberglass-reinforced resin materials, printed circuit board (PCB) materials, silica filler, polymer materials, polyimide materials, paper, glass fiber, non-woven glass fabric, glass, ceramic, other laminates, the like, or combinations thereof. In some embodiments, the core substrate may be a double-sided copper-clad laminate (CCL) substrate or the like. The core substrate 202 may have a thickness between about 30 µm and about 2000 µm, though other thicknesses are possible.

The interconnect structure 200 may have one or more routing structures 212/213 formed on each side of the core substrate 202 and through vias 210 extending through the core substrate 202. The routing structures 212/213 and through vias 210 provide additional electrical routing and interconnection. The through vias 210 may interconnect the routing structure 212 and the routing structure 213. The routing structures 212/213 may include one or more routing layers 208/209 and one or more dielectric layers 218/219. In some embodiments, the routing layers 208/209 and/or through vias 210 may comprise one or more layers of copper, nickel, aluminum, other conductive materials, the like, or a combination thereof. In some embodiments, the dielectric layers 218/219 may be include materials such as a build-up material, ABF, a prepreg material, a laminate material, another material similar to those described above for the core substrate 202 or the dielectric layers 106A-F, the like, or combinations thereof. The interconnect structure 200 shown in FIG. 11 shows two routing structures 212/213 having a total of six routing layers, but in other embodiments the interconnect structure 200 may include only one routing structure (e.g. 212 or 213) or the routing structures 212/213 may include more or fewer routing layers. Each routing layer of the routing structures 212/213 may have a thickness between about 5 μm and about 50 μm, and the routing structures 212/213 may each have a total thickness between about 2 μm and about 50 μm, though other thicknesses are possible.

In some embodiments, the openings in the core substrate 202 for the through vias 210 may be filled with a filler material 211. The filler material 211 may provide structural support and protection for the conductive material of the through vias 210. In some embodiments, the filler material 211 may be a material such as a molding material, epoxy, an epoxy molding compound, a resin, materials including monomers or oligomers, such as acrylated urethanes, rubber-modified acrylated epoxy resins, or multifunctional monomers, the like, or a combination thereof. In some embodiments, the filler material 211 may include pigments or dyes (e.g., for color), or other fillers and additives that modify rheology, improve adhesion, or affect other properties of the filler material 211. In some embodiments, the conductive material of the through vias 210 may completely fill the through vias 210, omitting the filler material 211.

In some embodiments, the interconnect structure 200 may include a passivation layer 207 formed over one or more sides of the interconnect structure 200. The passivation layer 207 may be a material such as a nitride, an oxide, a polyimide, a low-temp polyimide, a solder resist, combinations thereof, or the like. Once formed, the passivation layer 207 may be patterned (e.g., using a suitable photolithographic and etching process) to expose portions of the routing layers 208/209 of the routing structures 212/213.

FIGS. 12 through 18 illustrate intermediate steps in the bonding of interconnect structures 200A-B to the redistribution structure 100 to form a package structure 300 (see FIG. 18), in accordance with some embodiments. The interconnect structures 200A-B may be interconnect structures similar to the interconnect structure 200 described in FIG. 11. The interconnect structures 200A-B may be similar or may be different from each other. For example, the interconnect structures 200A-B may be the same size or may have different dimensions. More or fewer interconnect structures 200 may be attached than shown in the figures. The interconnect structures 200A-B are attached to the redistribution structure 100 in the corresponding interconnect regions 200'.

Figure 12:
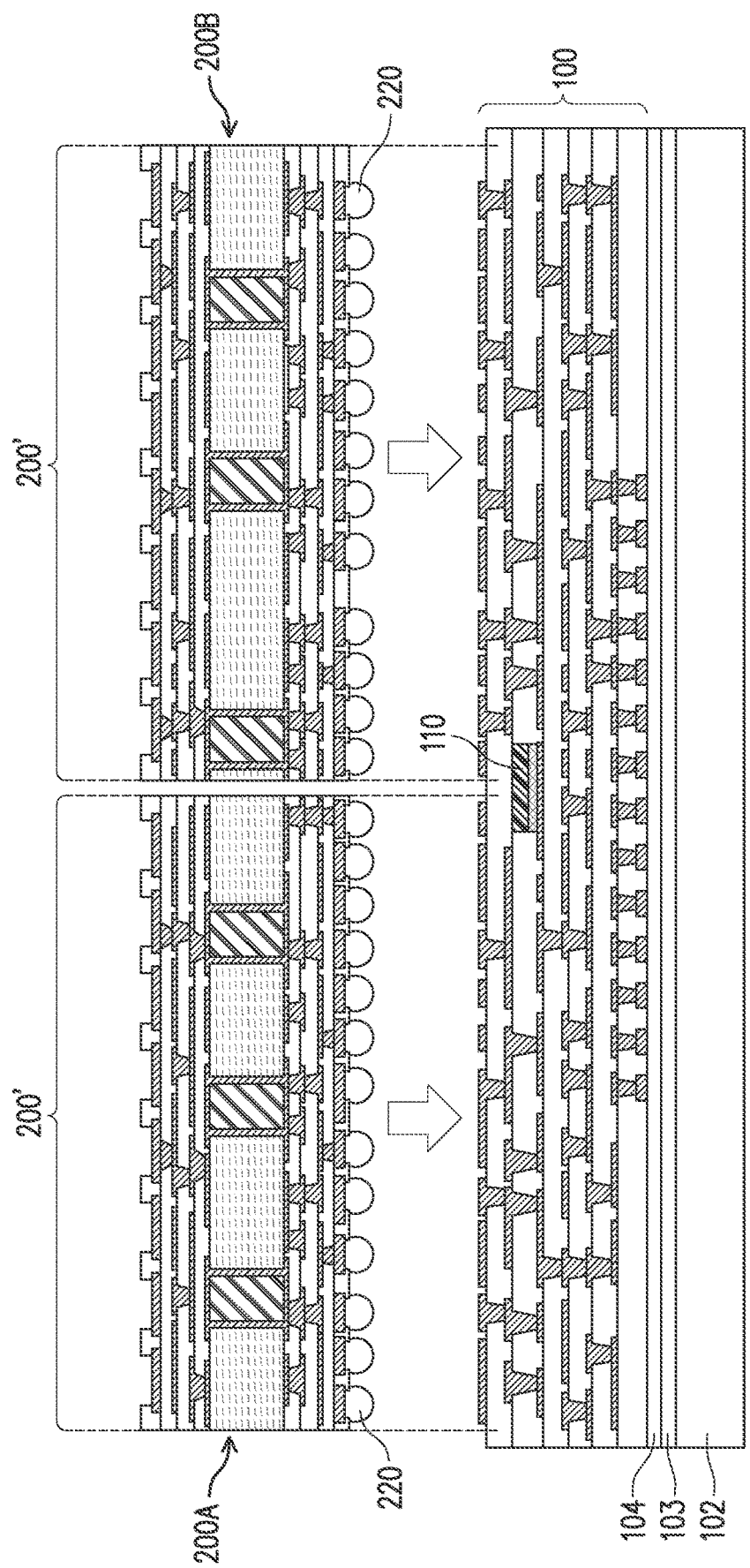
FIGS. 12, 13, and 14 illustrate cross-sectional views of intermediate steps of bonding interconnect structures to a redistribution structure, in accordance with some embodiments.

Referring to FIG. 12, conductive connectors 220 may be formed on the interconnect structures 200A-B, in accordance with some embodiments. The conductive connectors 220 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 220 may include a conductive material such as solder, copper, aluminum, gold, nickel, silver, palladium, tin, the like, or a combination thereof. In some embodiments, the conductive connectors 220 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 220 comprise metal pillars (such as a copper pillar) formed by a sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process. In other embodiments, the conductive connectors 220 are formed on the redistribution structure 100 instead of or in addition to the interconnect structures 200A-B.

Figure 13:
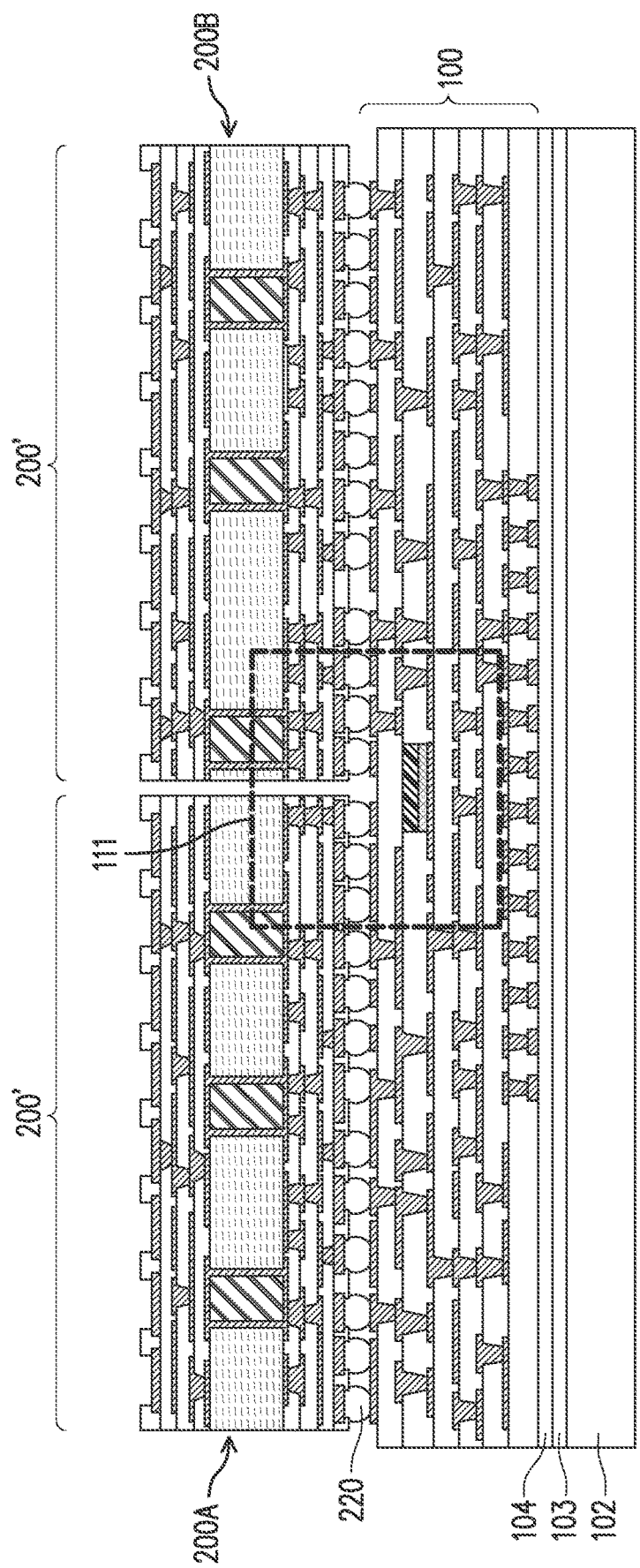

FIG. 13 illustrates a placement of the interconnect structures 200A-B into electrical connection with the redistribution structure 100, in accordance with some embodiments. In an embodiment, the conductive connectors 220 of the interconnect structures 200A-B are placed into physical contact with conductive lines or UBMs of the redistribution structure 100 using, e.g., a pick-and-place process. Once in physical contact, a reflow process may be utilized to bond the conductive connectors 220 of the interconnect structures 200A-B to the redistribution structure 100. In some embodiments, conductive connectors 220 are not formed on the interconnect structures 200A-B, and the interconnect structures 200A-B are bonded to the redistribution structure 100 using a direct bonding technique such as a thermocompression bonding technique.

Figure 14:
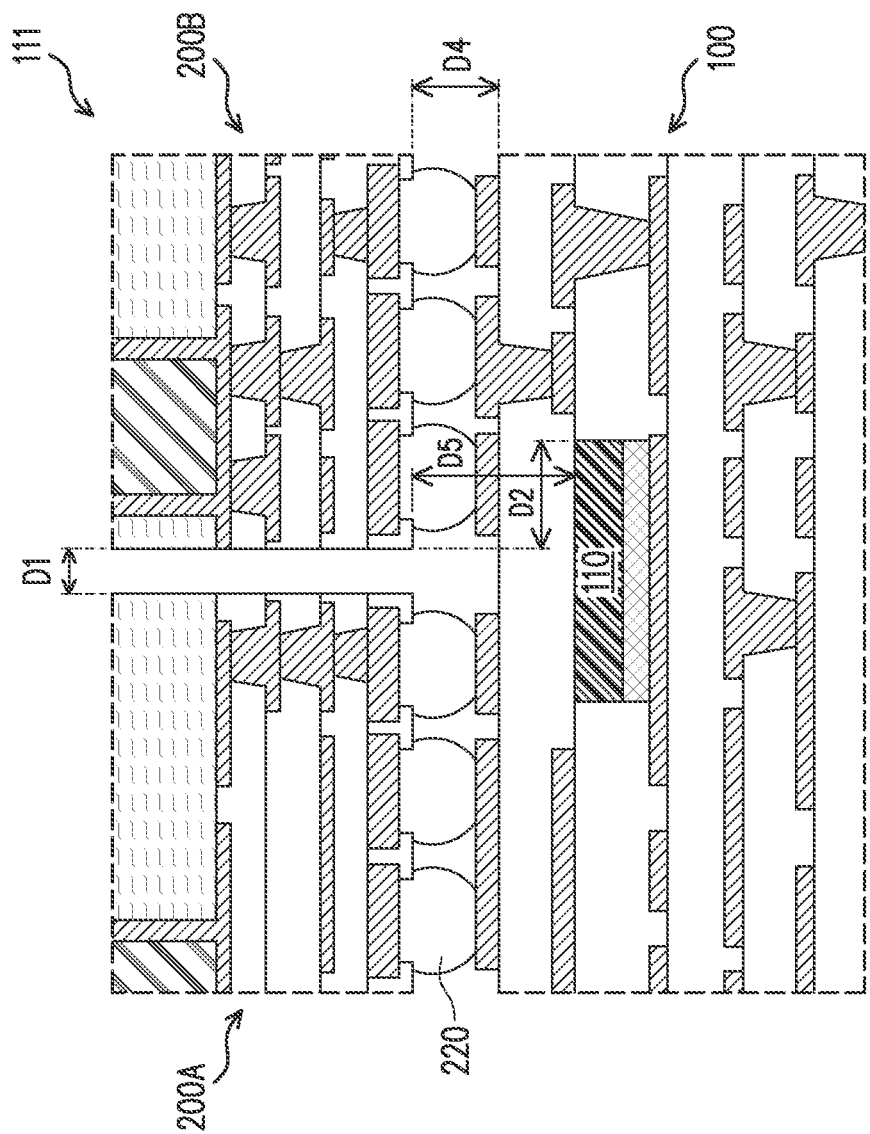

In some cases, bonding multiple interconnect structures 200 to the same redistribution structure 100 can cause stress within the redistribution structure 100. By incorporating one or more internal supports 110 within the redistribution structure 100, this stress can be reduced. In some cases, stress within the redistribution structure 100 is approximately aligned with the gaps between adjacent interconnect structures 200, and this stress within the redistribution structure 100 can be reduced by using one or more internal supports 110 that are approximately aligned with the gaps between the adjacent interconnect structures 200. Referring to FIG. 14, a magnified cross-section of the region 111 indicated in FIG. 13 is shown. As shown in FIGS. 13-14, the internal support 110 is approximately aligned with the gap between the interconnect structure 200A and the interconnect structure 200B. As described previously in FIG. 7 for the interconnect regions 200', the interconnect structures 200A-B have a gap separation distance D1, and edge of an internal support 110 and an edge of an interconnect structure 200A/200B has an overlap distance D2. In some embodiments, the distance D4 between the redistribution structure 100 and an interconnect structure 200 is in the range of about 10 μm to about 300 μm, and the distance D5 between an internal support 110 and an overlying interconnect structure 200 is in the range of about 100 μm to about 15,000 μm. Other distances are possible. In some embodiments, the ratio of D5:D2 has a ratio of about 5:1 to about 30:1. In some cases, an internal support 110 having a ratio of D5:D2 in this example range may provide more structural support and stress reduction for the redistribution structure 100 than an internal support 110 having a ratio outside of this range. Other ranges of the ratio D5:D2 are possible.

Figure 15:
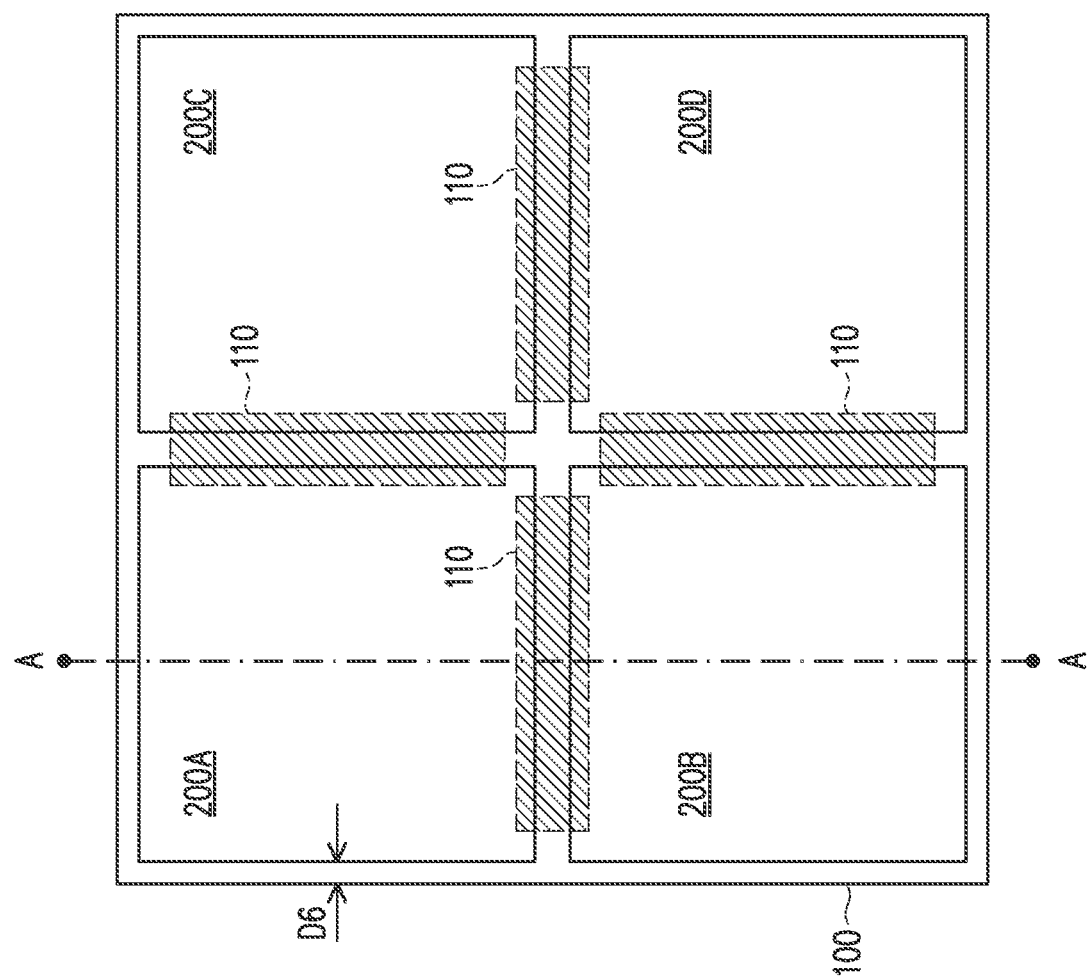
FIG. 15 illustrates a plan view of an intermediate step of bonding interconnect structures to a redistribution structure, in accordance with some embodiments.

FIG. 15 illustrates a plan view of the structure shown in FIG. 14, in accordance with some embodiments. The plan view of FIG. 15 is similar to the plan view shown in FIG. 7, and the example cross-section A-A shown in FIG. 15 corresponds to the cross-sectional view shown in FIG. 14. As shown in FIG. 15, interconnect structures 200A-D are attached to the redistribution structure 100 in the interconnect regions 200'. Each adjacent pair of interconnect structures 200A-D has a corresponding internal support 110 that reduces stress in the redistribution structure 100 associated with that adjacent pair of interconnect structures 200A-D. The interconnect structures 200A-D may have different sizes or shapes than shown, and may have a different arrangement than shown. More or fewer interconnect structures 200 may be present than shown. In some embodiments, a distance D6 between the edge of an interconnect structure 200 and the edge of the redistribution structure 100 is in the range of about 40 µm to about 5,000 µm, though other distances are possible.

Figure 16:
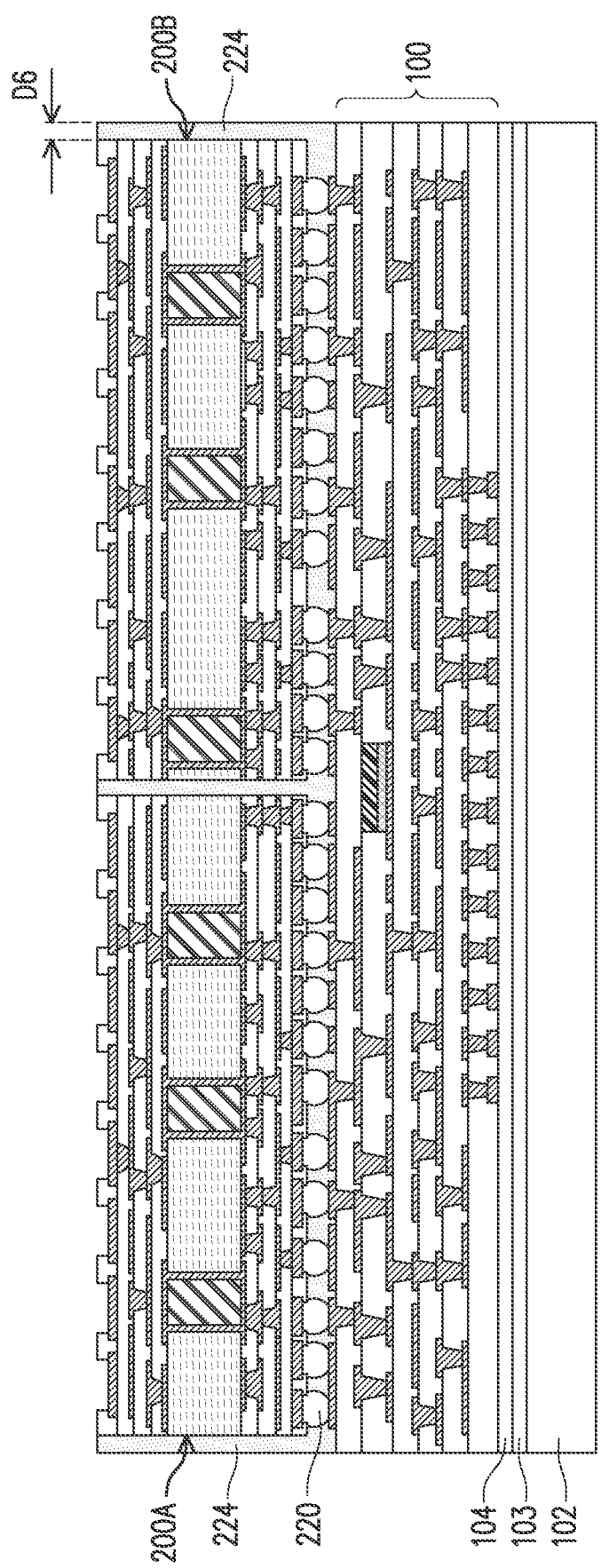
FIGS. 16, 17, and 18 illustrate cross-sectional views of intermediate steps of forming a package structure, in accordance with some embodiments.

In FIG. 16, an underfill 224 is deposited along the sidewalls of the interconnect structures 200A-B and in the gap between the interconnect structures 200A-B and the redistribution structure 100. The underfill 224 may be a material such as a molding compound, an encapsulant, an epoxy, an underfill, a molding underfill (MUF), a resin, or the like. The underfill 224 can protect the conductive connectors 220 and provide structural support for the package structure 300 (see FIG. 18). In some embodiments, the underfill 224 may be applied using a compression molding process, a transfer molding process, or the like. In some embodiments, the underfill 224 may be applied in liquid or semi-liquid form and then subsequently cured. In some embodiments, the underfill 224 may be thinned after deposition. The thinning may be performed, e.g., using a mechanical grinding or CMP process. In some embodiments, the underfill 224 may be deposited over the interconnect structures 200A-B, and the thinning may expose the interconnect structures 200A-B.

Figure 17:
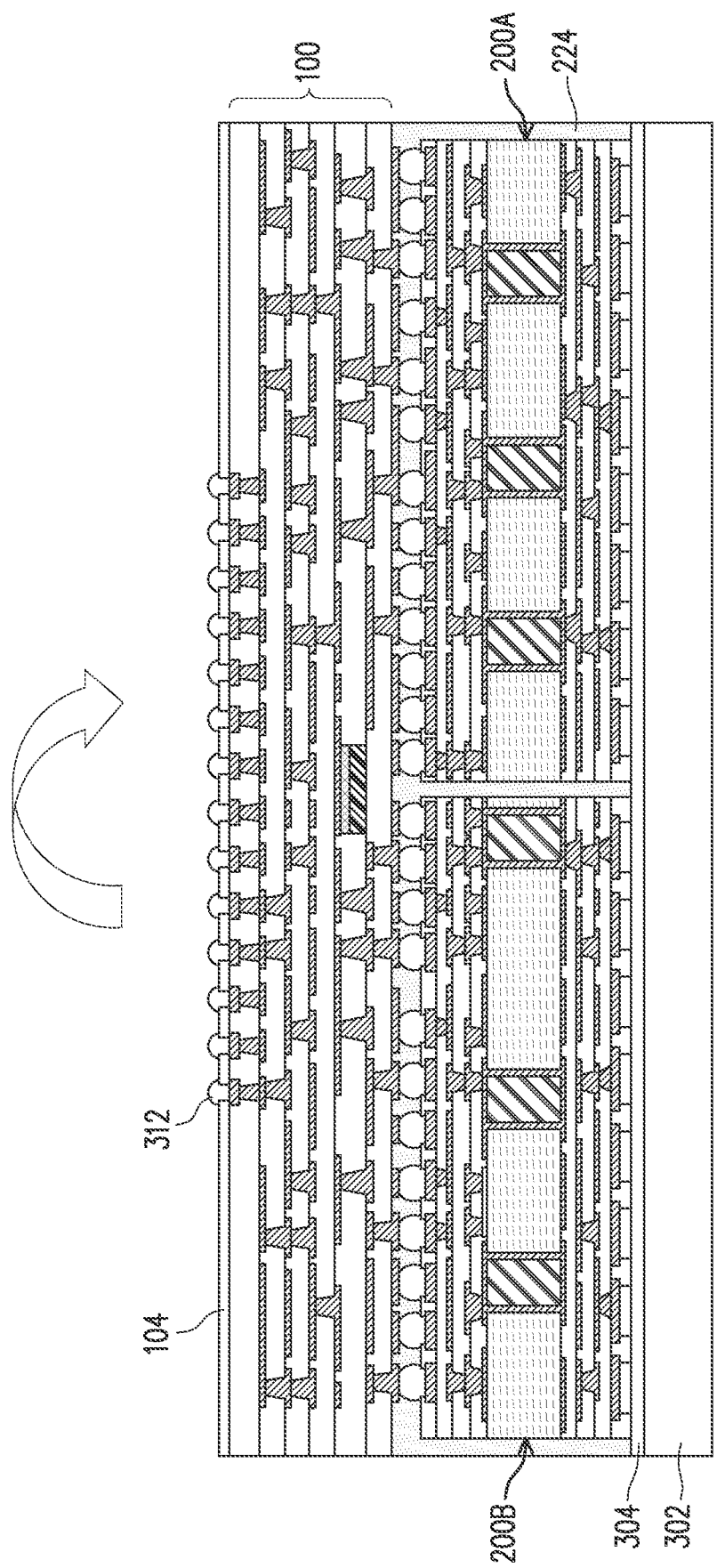

Turning to FIG. 17, the first carrier substrate 102 is de-bonded to detach (or "de-bond") the first carrier substrate 102. The structure is then flipped over and bonded to a second carrier substrate 302, in accordance with some embodiments. In some embodiments, the de-bonding includes projecting a light such as a laser light or an UV light on the release layer 103 of the first carrier substrate 102 so that the release layer 103 decomposes under the heat of the light and the first carrier substrate 102 can be removed. The second carrier substrate 302 may be a carrier substrate similar to those described above for the first carrier substrate 102. For example, the second carrier substrate 302 may be a wafer similar to that shown in FIG. 2B or a panel similar to that shown in FIG. 2C. A release layer 304 may be formed on the second carrier substrate 302 to facilitate attachment of the structure to the second carrier substrate 302. Multiple structures may be formed on the second carrier substrate 302 and then subsequently singulated to form individual package structures 300 (see FIG. 18). The structures may be singulated, for example using one or more saw blades that separate the structure into discrete pieces, forming one or more singulated structures. However, any suitable method of singulation, including laser ablation or one or more wet etches, may also be utilized. The singulation process may leave underfill 224 remaining on the sidewalls of the interconnect structures 200, or the singulation process may remove underfill 224 from the sidewalls of the interconnect structures 200. After the singulation process, each redistribution structure 100 may have sidewalls that are coplanar with the sidewalls of the interconnect structures 200, or may have sidewalls that are coplanar with the underfill 224 remaining on the sidewalls of the interconnect structures 200.

Still referring to FIG. 17, conductive connectors 312 are formed on the redistribution structure 100, in accordance with some embodiments. The conductive connectors 312 allow for physical and electrical connection to dies or another package structure, such as integrated circuit package 350 (see FIG. 18). In some embodiments, openings may be formed in the protection layer 104 to expose conductive lines (e.g., conductive lines 105A) of the redistribution structure 100. The openings expose portions of the conductive lines on which conductive connectors 312 are subsequently formed. The openings may be formed, for example, using a laser drilling process. In other embodiments, the openings may be formed by forming a photoresist over the protection layer 104, patterning the photoresist, and etching the protection layer 104 through the patterned photoresist using a suitable etching process (e.g., a wet etching process and/or a dry etching process).

The conductive connectors 312 may then be formed on the conductive lines 105A, making electrical connection to the redistribution structure 100. The conductive connectors 312 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 312 may include a conductive material such as solder, copper, aluminum, gold, nickel, silver, palladium, tin, the like, or a combination thereof. In some embodiments, the conductive connectors 312 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 312 comprise metal pillars (such as a copper pillar) formed by a sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process. In some embodiments, UBMs (not shown) are formed on the conductive lines 105A before forming the conductive connectors 312.

Figure 18:
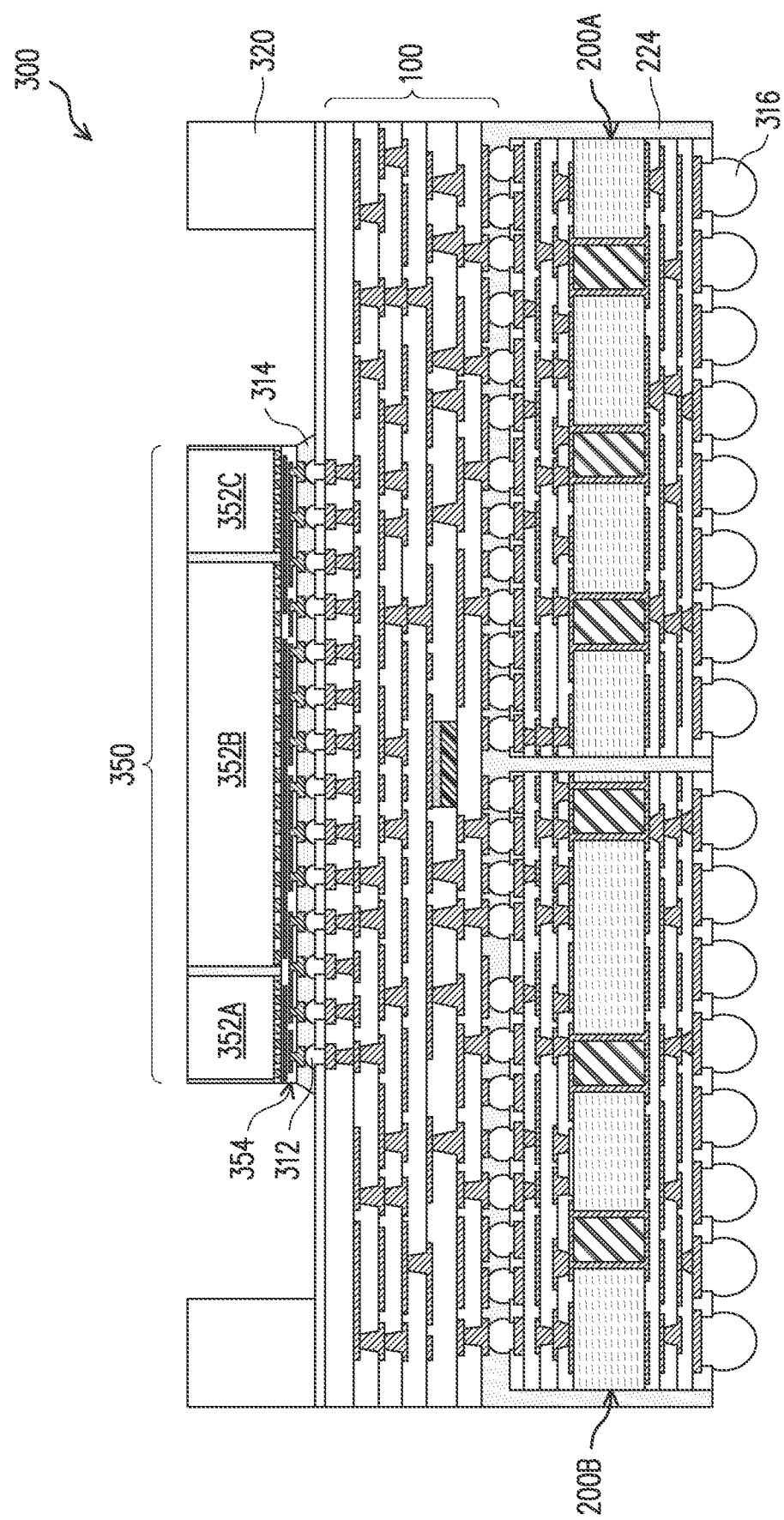

FIG. 18 illustrates the attachment of an integrated circuit package 350 to the conductive connectors 312 to form a package structure 300, in accordance with some embodiments. The integrated circuit package 350 is physically and electrically connected to the conductive connectors 312 to make electrical connection between the integrated circuit package 350 and the redistribution structure 100. The integrated circuit package 350 may be placed on the conductive connectors 312 using a suitable process such as a pick-and-place process. FIG. 18 shows the attachment of one integrated circuit package 350, but in other embodiments, one, two, or more than three integrated circuit packages 350 may be attached to the conductive connectors 312. In some embodiments, the integrated circuit package 350 attached to the conductive connectors 312 may include more than one of the same type of integrated circuit package or may include two or more different types of integrated circuit package. FIG. 18 illustrates a package structure 300 after singulation, which may be performed at any suitable previous step during the formation process. In some embodiments, the lateral distance between opposite sides of the package structure 300 is between about 30 mm and about 500 mm, though other distances are possible.

The integrated circuit package 350 may include one or more integrated circuit dies 352, in some embodiments. The cross-sectional view of FIG. 18 shows three integrated circuit dies 352A-C, but an integrated circuit package 350 may include more or fewer integrated circuit dies 352 than shown. The integrated circuit dies 352 may comprise, for example, a logic die (e.g., central processing unit (CPU), graphics processing unit (GPU), system-on-a-chip (SoC), component-on-a-wafer (CoW), application processor (AP), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), an input-output (I/O) die, the like, or combinations thereof. For example, in some embodiments, the integrated circuit package 350 shown in FIG. 18 includes a logic die 352B and multiple I/O dies 352A and 352C that interface with the logic die 352B, though other combinations of integrated circuit dies 352 are possible. The integrated circuit dies 352 may be a memory device such as a hybrid memory cube (HMC) module, a high bandwidth memory (HBM) module, or the like that includes multiple memory dies. The integrated circuit dies 352 may be formed in one or more wafers, which may include different device regions that are singulated in subsequent steps. The integrated circuit dies 352 may be packaged with other similar or different integrated circuit dies 352 using known manufacturing techniques.

The integrated circuit package 350 may include a routing structure 354, that provides electrical routing and connections between, for example, the integrated circuit dies 352. The routing structure 354 may also provide connection from the integrated circuit package 350 to the conductive connectors 312. The routing structure 354 may comprise one or more redistribution layers, an integrated fan-out structure (InFO), through-substrate vias (TSVs), metallization patterns, electrical routing, conductive lines, conductive vias, the like, or combinations thereof.

The integrated circuit package 350 may be placed such that conductive regions of the integrated circuit package 350 (e.g., contact pads, conductive connectors, solder bumps, or the like, which may be part of the routing structure 354) are aligned with corresponding conductive connectors 312 on the redistribution structure 100. Once in physical contact, a reflow process may be utilized to bond the conductive connectors 312 to the semiconductor device 350, forming the package structure 300. As shown in FIG. 18, an underfill 314 may be deposited between the integrated circuit package 350 and the redistribution structure 100. The underfill 314 may also at least partially surround the conductive connectors 312. The underfill 314 may be a material such as a molding compound, an epoxy, an underfill, a molding underfill (MUF), a resin, or the like, and may be similar to underfill 224 described previously.

In some cases, the multiple interconnect structures 200 of the package structure 300 can cause stress within the routing structure 354. Incorporating one or more internal supports 110 within the redistribution structure 100 can also reduce this stress within the routing structure 354. In this manner, the risk of problems such as bending or cracking within the routing structure 354 can be reduced. In some cases, an internal support 110 may be incorporated within a redistribution structure 100 to reduce stress within both the redistribution structure 100 and the routing structure 354. In some embodiments, an internal support 110 may be incorporated within a particular layer of the redistribution structure 100 to reduce stress within the routing structure 354. In some embodiments, multiple internal supports 110 may be incorporated on different layers of the redistribution structure 100 to reduce stress within both the redistribution structure 100 and the routing structure 354. In some cases, multiple integrated circuit dies 352 of an integrated circuit package 350 can induce stress within the redistribution structure 100 and/or the routing structure 354. Internal supports 110 may also be incorporated within the redistribution structure 100 to reduce stress from the multiple integrated circuit dies 352, described in greater detail below for FIGS. 29-30B.

Still referring to FIG. 18, external connectors 316 may be formed on the interconnect structures 200. In some embodiments, UBMs are first formed on the interconnect structures 200, and the external connectors 316 are formed over the UBMs. The external connectors 316 may be, for example, contact bumps or solder balls, although any suitable types of connectors may be utilized. In an embodiment in which the external connectors 316 are contact bumps, the external connectors 316 may include a material such as tin, or other suitable materials, such as silver, lead-free tin, or copper. In an embodiment in which the external connectors 316 are solder bumps, the external connectors 316 may be formed by initially forming a layer of solder using such a technique such as evaporation, electroplating, printing, solder transfer, ball placement, etc. Once a layer of solder has been formed on the structure, a reflow may be performed in order to shape the material into the desired bump shape for the external connectors 316. In some embodiments, the external connectors 316 may have a pitch that is between about 100 µm and about 1,500 µm, though other distances are possible. In this manner, a package structure 300 may be formed.

In some embodiments, an optional supporting ring 320 is attached to the package structure 300 to provide further mechanical support to reduce the warpage of the package structure 300. The supporting ring 320 may be attached to the package structure 300 by an adhesive, an adhesive film, or the like. The supporting ring 320 may be a material such as metal, though other materials may be used. In some cases, the outer edges of the supporting ring 320 may be flush with the sidewalls of the package structure 300. A supporting ring 320 may have a thickness between about 50 µm and about 1,500 µm, though other thicknesses are possible.

FIGS. 19 through 26 illustrate intermediate steps in the formation of a package structure 400 (see FIG. 26), in accordance with some embodiments. The package structure 400 is similar to the package structure 300 shown in FIG. 18, except that the redistribution structure 402 includes first redistribution layers 408A and second redistribution layers 408B that are formed using different techniques. In some cases, the use of a different technique to form the second redistribution layers 408B can result in improve electrical performance, described in greater detail below. The package structure 400 includes one or more internal supports 110 (see FIG. 20) within the redistribution structure 402 that add structural stability and reduce warping. In subsequent steps, multiple interconnect structures 200 (see FIG. 25) are attached to the redistribution structure 402. The interconnect regions 200' and 200' shown in FIGS. 19-25 indicate regions where the interconnect structures 200 are subsequently attached (see FIG. 25), and each interconnect region 200' has the same dimensions as the corresponding interconnect structure 200.

Figure 19:
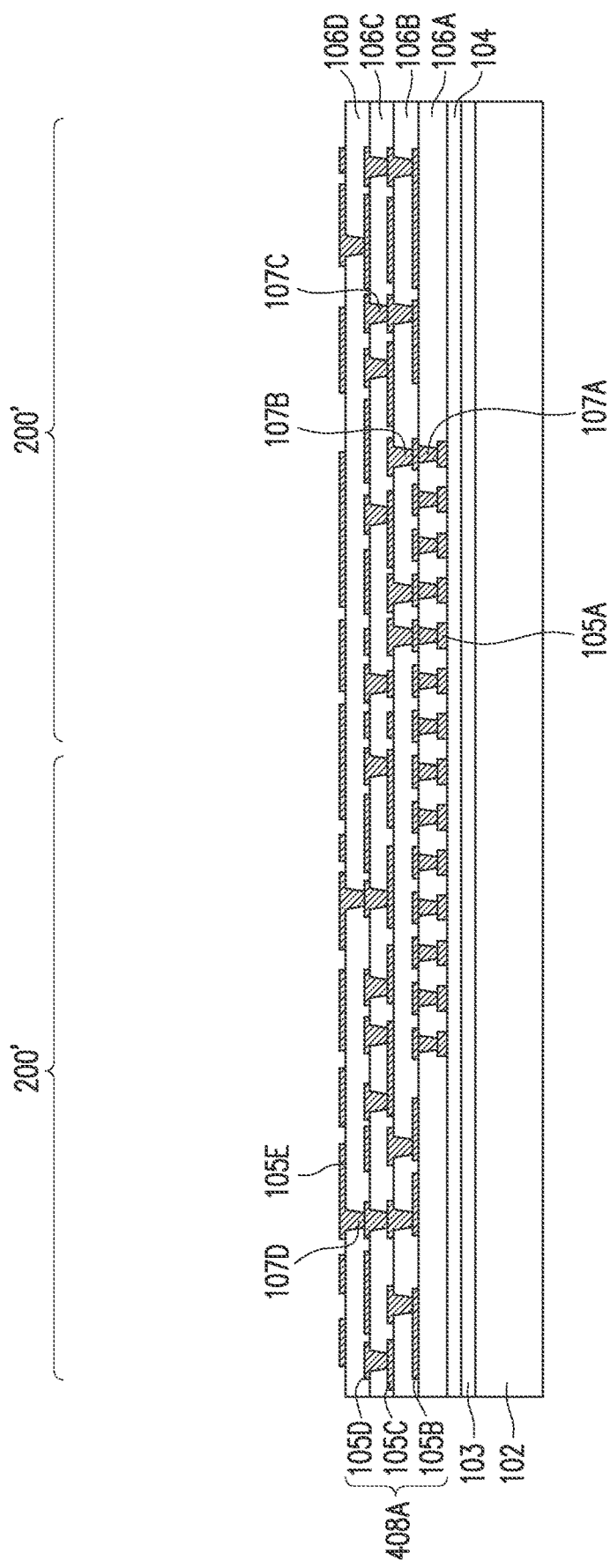
FIGS. 19, 20, 21, 22, 23, and 24 illustrate cross-sectional views of intermediate steps of forming first redistribution layers and second redistribution layers of a redistribution structure, in accordance with some embodiments.

FIG. 19 illustrates the formation of first redistribution layers 408A formed over a first carrier substrate 102, in accordance with some embodiments. The first redistribution layers 408A shown in FIG. 19 may be similar to the first redistribution layers 108A shown in FIG. 4, and may be formed in a similar manner. For example, the first redistribution layers 408A include multiple conductive lines 105A-E, multiple dielectric layers 106A-D, and multiple conductive vias 107A-D. The first redistribution layers 408A are shown as an illustrative example, and more or fewer conductive lines, dielectric layers, and/or conductive vias may be used in other embodiments.

Figure 20:
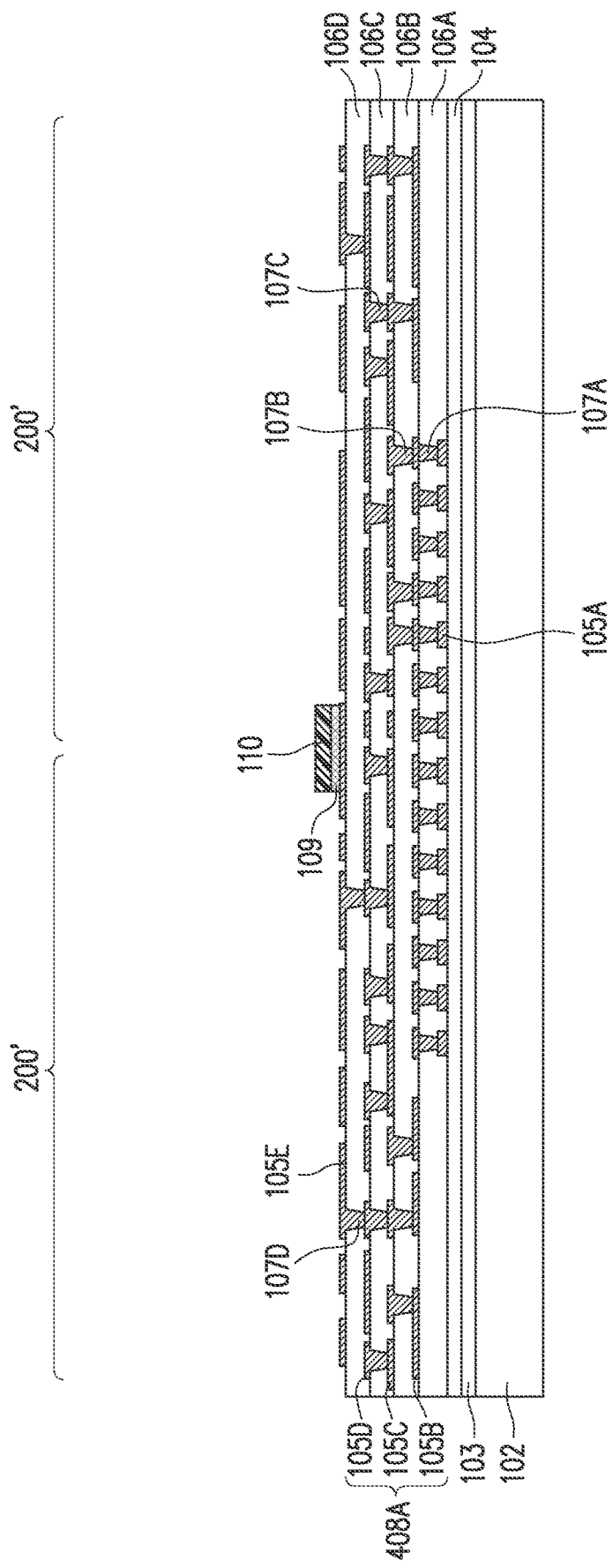

In FIG. 20, one or more internal supports 110 are attached to the first redistribution layers 408A, in accordance with some embodiments. The internal supports 110 may be similar to the internal supports 110 described for FIG. 6 and elsewhere herein. An adhesive 109 may be used to attach the internal supports 110 to the first redistribution layers 408A. The internal supports 110 may be placed using a pick-and-place technique or the like.

FIGS. 21 through 24 illustrate intermediate steps in the formation of second redistribution layers 408B (see FIG. 24) of the redistribution structure 402, in accordance with some embodiments. The second redistribution layers 408B include metallization patterns 405A-B and dielectric layers 406A-B. The second redistribution layers 408B may have a different number of metallization patterns or dielectric layers than shown. If fewer redistribution layers of the second redistribution layers 408B are to be formed, some steps and processes discussed below may be omitted. If more redistribution layers are to be formed, some steps and processes discussed below may be repeated.

Figure 21:
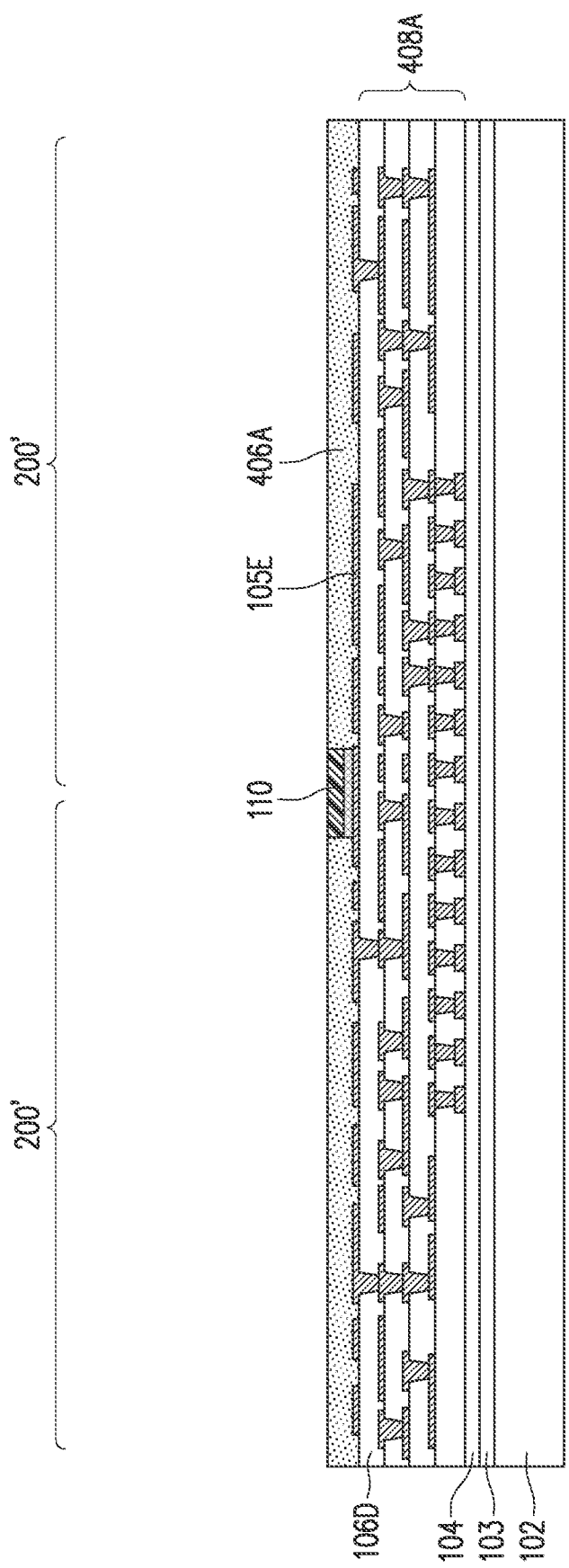
Figure 22:
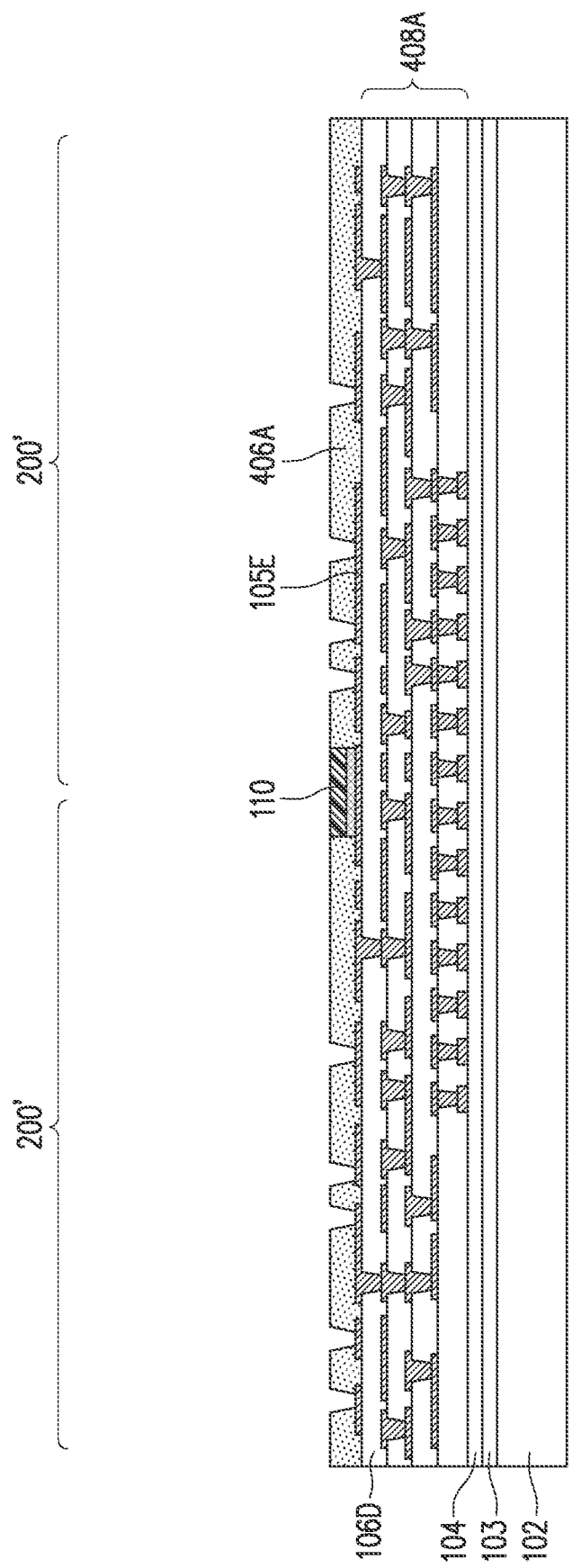

In FIG. 21, a dielectric layer 406A is formed on the dielectric layer 106D, the conductive lines 105E, and the internal supports 110. In some embodiments, the dielectric layer 406A is formed of a photosensitive material such as PBO, polyimide, BCB, or the like, which may be patterned using a lithography process. The dielectric layer 406A may be formed by spin coating, lamination, CVD, the like, or a combination thereof. In FIG. 22, the dielectric layer 406A is then patterned to form openings that expose portions of the conductive lines 105E. The patterning may be by an acceptable process, such as by exposing to light and developing the dielectric layer 406A when the dielectric layer 406A is a photosensitive material or by etching using, for example, an anisotropic etch when the dielectric layer 406A is not photosensitive.

Figure 23:
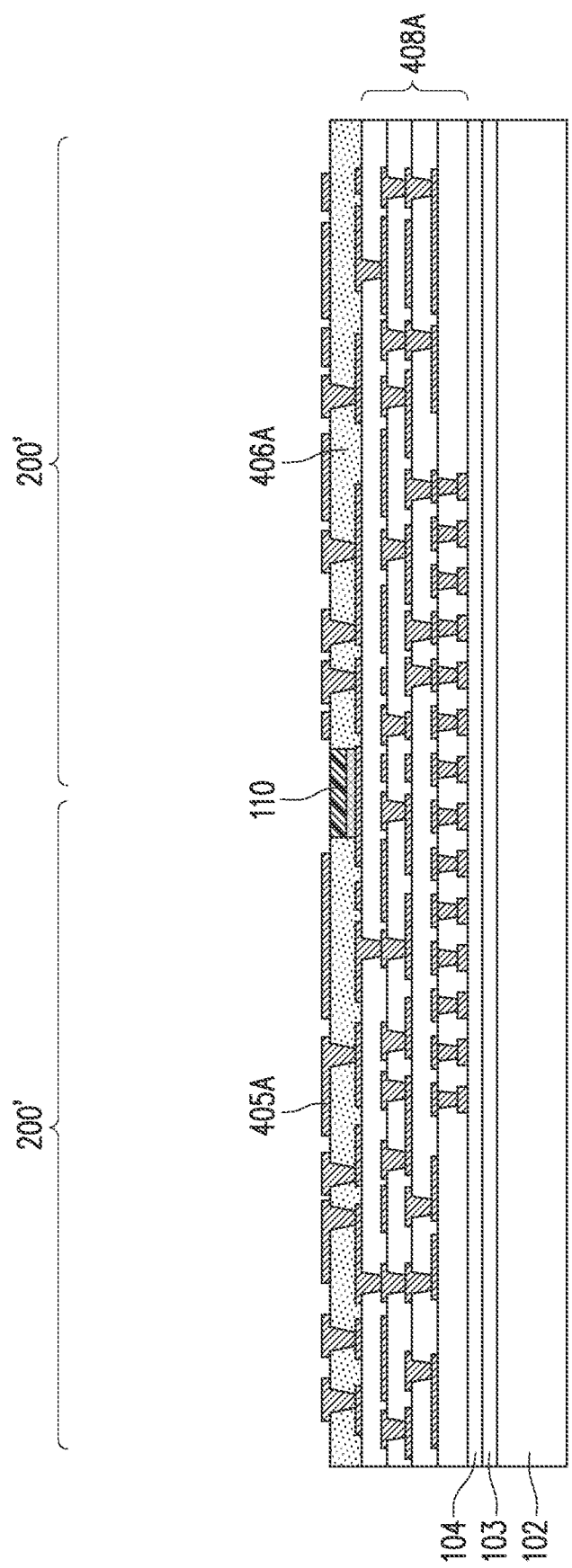

In FIG. 23, a metallization pattern 405A is formed over the dielectric layer 406A, in accordance with some embodiments. The metallization pattern 405A includes conductive elements extending along the major surface of the dielectric layer 406A and extending through the dielectric layer 406A to physically and electrically couple to an underlying conductive layer (e.g., the conductive lines 105E). As an example to form the metallization pattern 405A, a seed layer is formed over the dielectric layer 406A and in the openings extending through the dielectric layer 406A to conductive lines 105E. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light and developed for patterning. The patterning forms openings through the photoresist to expose the seed layer, with the pattern of the openings corresponding to the metallization pattern 405A. A conductive material is then formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The combination of the conductive material and underlying portions of the seed layer form the metallization pattern 405A. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The combination of the dielectric layer 406A and the metallization pattern 405A form a redistribution layer of the second redistribution layers 408B.

Figure 24:
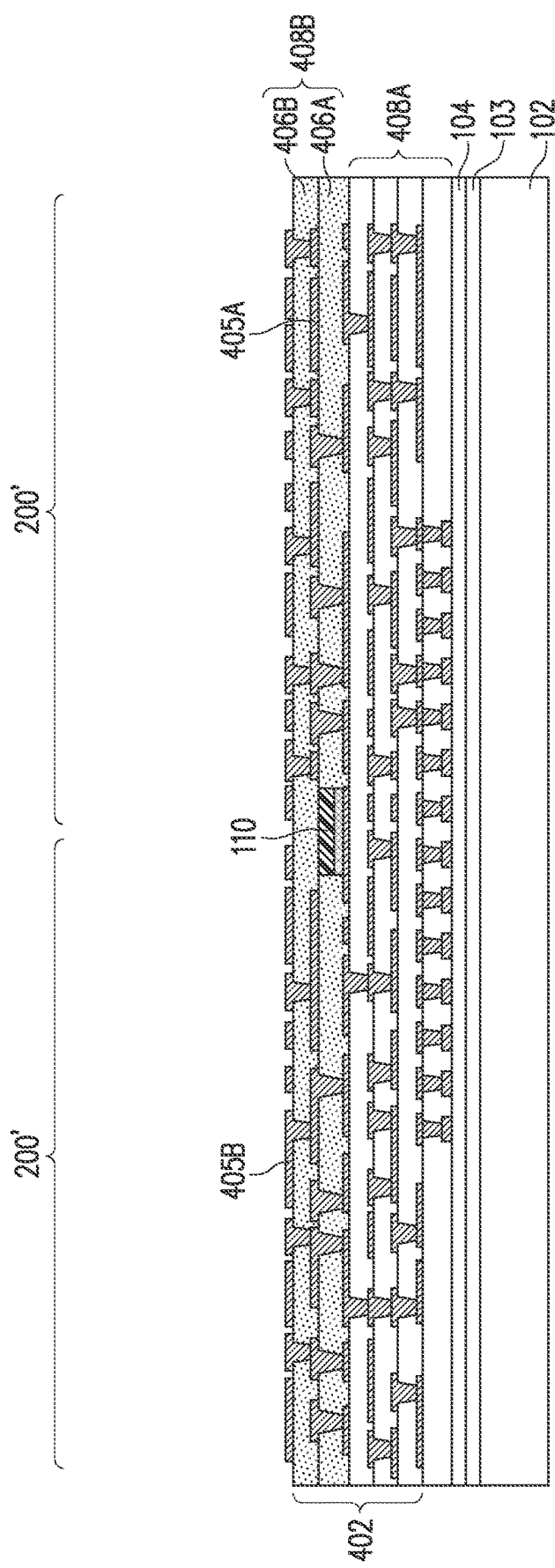

In FIG. 24, the dielectric layer 406B and the metallization pattern 405B are formed. The dielectric layer 406B and the metallization pattern 405B may be formed using similar materials and techniques as the dielectric layer 406A and the metallization pattern 405A. In some embodiments, some or all of the dielectric layers of the second redistribution layers 408B may be thinner than the dielectric layers of the first redistribution layers 408A. In some embodiments, one or more of the dielectric layers (e.g., dielectric layer 406A or 406B) of the second redistribution layers 408B may have a different thickness than other dielectric layers of the second redistribution layers 408B. For example, the dielectric layer 406B may be thinner than the dielectric layer 406A. In some embodiments, the dielectric layers of the second redistribution layers 408B each have a thickness in the range of about 2 μm to about 15 μm, although other thicknesses are possible.

In some embodiments, some of the metallization patterns of the second redistribution layers 408B may have a different size than underlying metallization patterns of the second redistribution layers 408B. For example, the metallization pattern 405A may be wider or thicker than the metallization pattern 405B. In some embodiments, the metallization patterns of the second redistribution layers 408B have a different size than the conductive lines of the first redistribution layers 408A. For example, the conductive lines and/or conductive vias of the first redistribution layers 408A may be wider or thicker than the conductive lines and/or vias of the metallization patterns of the second redistribution layers 408B, thereby allowing for longer horizontal routing.

In some embodiments, longer linear electrical pathways are formed in the first redistribution layers 408A using thicker and/or wider metallization dimensions, while second redistribution layers 408B have overall shorter linear electrical pathways. In some embodiments, the roughness of the planarized layers of the first redistribution layers 408A can be well controlled and more easily built up to larger thicknesses. In such a case, thicker and wider metallization dimensions may be utilized in the planarized layers to decrease the overall impedance of metallization pathways per unit length—thus improving circuit efficiency and/or reducing heat generation and power consumption. For example, circuit loads may be reduced for the same linear length of a given metallization pathway by increasing the thickness and/or width of the metallization pattern, thus increasing efficiency and while reducing power consumption and heat generation. Larger overall package dimensions may be achieved with the same or similar circuit design by extending metallization pathways horizontally with thicker and/or wider metallization pathways.

Figure 25:
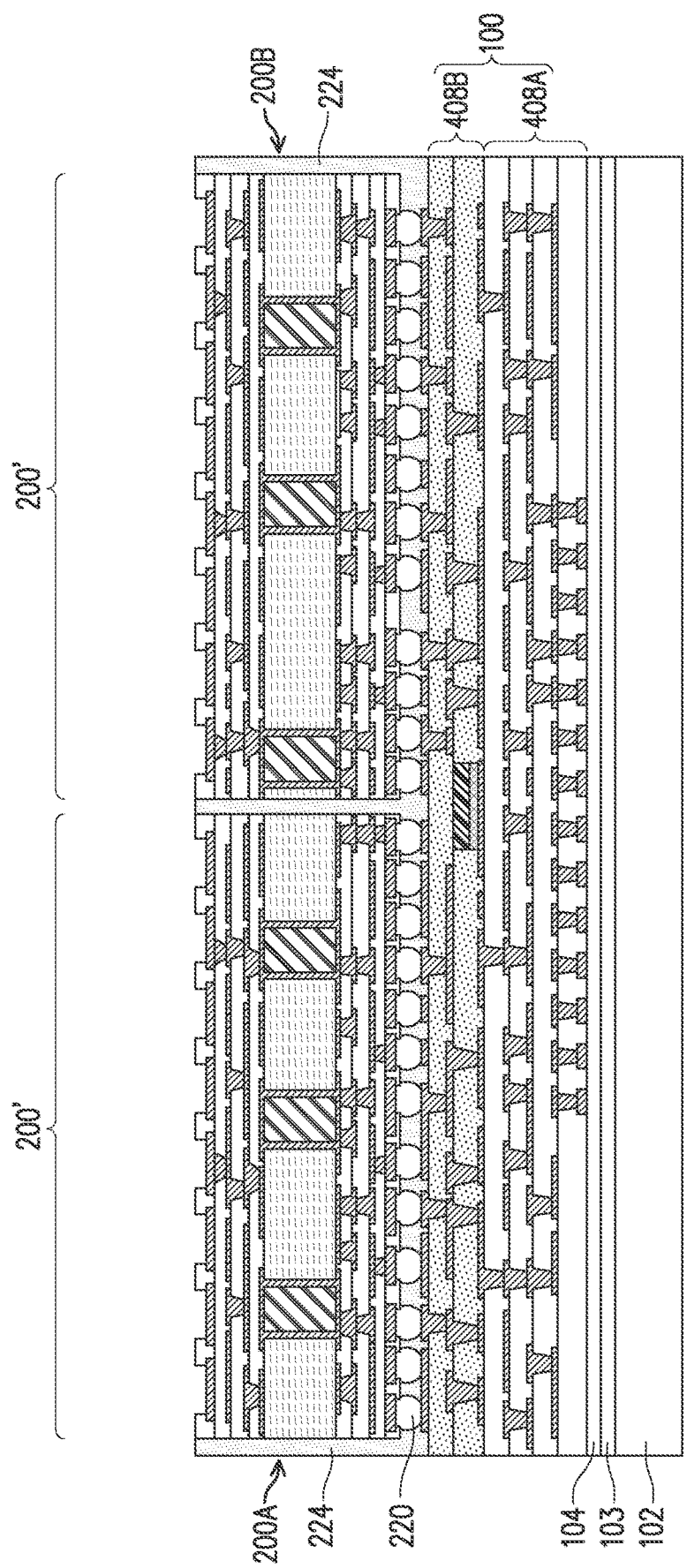
FIGS. 25 and 26 illustrate cross-sectional views of intermediate steps of forming a package structure, in accordance with some embodiments.

Turning to FIG. 25, interconnect structures 200A-B are attached to the redistribution structure 100, in accordance with some embodiments. The interconnect structures 200A-B may be similar to the interconnect structures 200 described previously for FIG. 11. The interconnect structures 200A-B may be attached to the redistribution structure 402 in the interconnect regions 200' in a manner similar to that described previously for FIGS. 12-16. An underfill 224 may be deposited along the sidewalls of the interconnect structures 200A-B and in the gap between the interconnect structures 200A-B and the redistribution structure 402. Conductive connectors 220 may be formed to make physical and electrical connection between the interconnect structures 200A-B and the topmost metallization pattern (e.g., metallization pattern 405B) of the redistribution structure 402.

Figure 26:
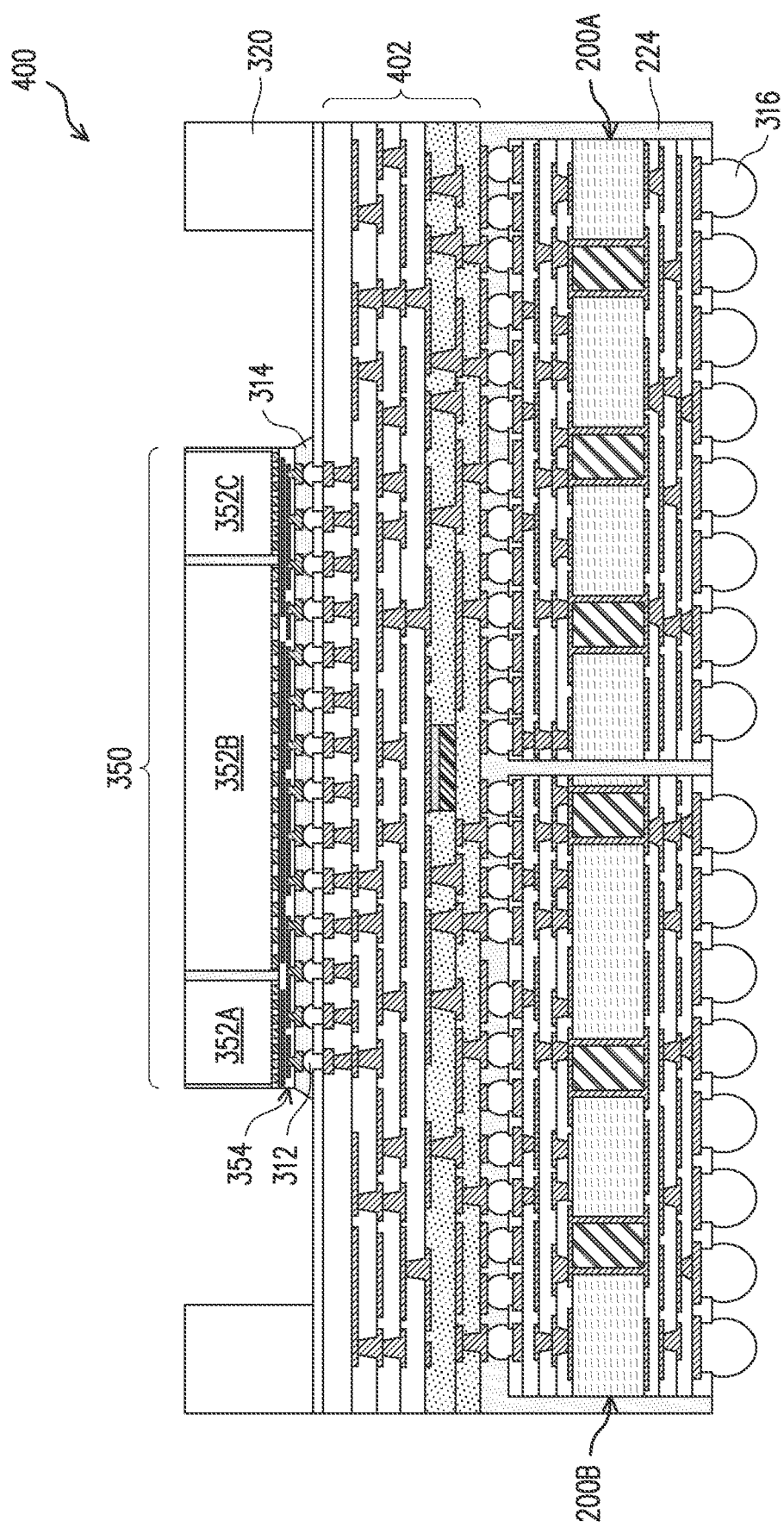

FIG. 26 illustrates the attachment of an integrated circuit package 350 to redistribution structure 402 to form a package structure 400, in accordance with some embodiments. The integrated circuit package 350 may be similar to the integrated circuit package 350 described previously for FIG. 18, and may be attached in a similar manner. For example, conductive connectors 312 may be formed on the redistribution structure 402, which may be similar to the conductive connectors 312 described for FIG. 17. The integrated circuit package 350 is physically and electrically connected to the conductive connectors 312 to make electrical connection between the integrated circuit package 350 and the redistribution structure 402. Additionally, external connectors 316 and/or a supporting ring 320 may be formed in a manner similar to that described previously for FIG. 18.

Figure 27:
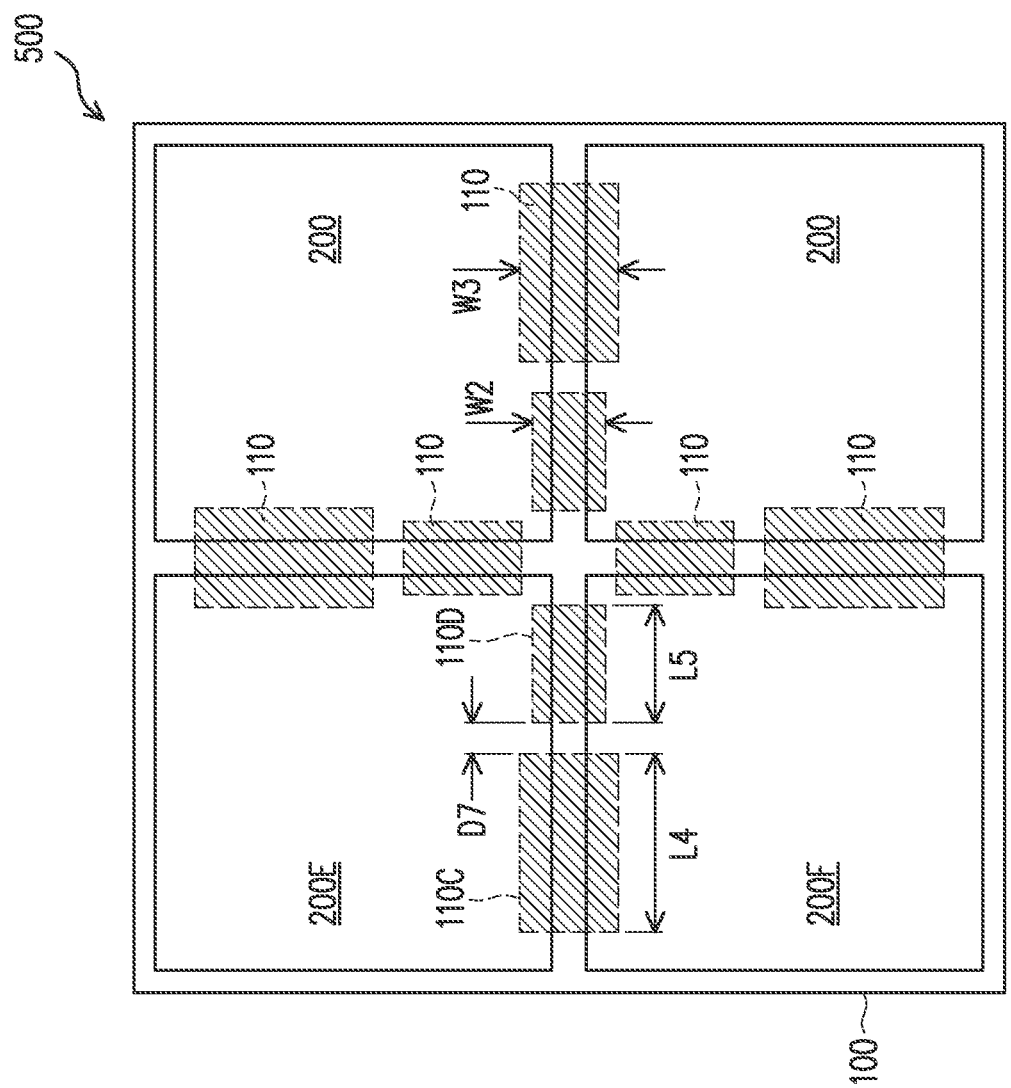

FIGS. 27 through 30B illustrate cross-sectional views and plan views of various embodiments of package structures including internal supports 110. The package structures shown in FIGS. 27 through 30B are illustrative examples, and in other embodiments features such as the internal supports 110 may have different dimensions, number, configuration, and/or arrangements. FIG. 27 illustrates a plan view of a package structure 500 that includes multiple internal supports 110 that laterally overlap the same interconnect structures 200. The plan view of FIG. 27 is similar to the plan view showed in FIG. 15. As an example, in FIG. 27, internal supports 110C and 110D are indicated that each laterally overlap interconnect structures 200E and 200F. The internal supports 110C and 110D are laterally separated by a distance D7 that may be in the range of 20 μm to 5000 μm, though other distances are possible. In other embodiments, more than two internal supports 110 may laterally overlap the same interconnect structures 200, or different pairs of interconnect structures 200 may have different numbers of associated internal supports 110.

The internal supports 110 may have the same dimensions or have different dimensions, and the internal supports may be on different layers of the redistribution structure 100. As shown in FIG. 27, the internal supports 110 may have different lengths or widths. For example, within the same redistribution structure 100, some internal supports may have a length L4 that is in the range of about 2 mm to about 30 mm, and other internal supports may have a length L5 that is in the range of about 2 mm to about 30 mm. In some embodiments, within the same redistribution structure 100, some internal supports may have a width W2 that is in the range of about 2 mm to about 4 mm, and other internal supports may have a width W3 that is in the range of about 3 mm to about 8 mm. In some embodiments, two internal supports 110 within the same redistribution structure 100 may have a ratio of lengths L4:L5 that is in the range of about 1:15 to about 1:1, or may have a ratio of widths W3:W2 that is in the range of about 4:1 to about 3:4. Other lengths, widths, or ratios are possible. In some cases, the use of multiple internal supports 110 as shown in FIG. 27 may allow for electrical routing to be formed between internal supports 110, which can improve design flexibility. In some cases, the use of multiple internal supports 110 in this manner may allow the internal supports 110 to be sized more efficiently for reducing stress within the redistribution structure 100 (or the routing structure 354), or placed within the redistribution structure 100 in locations that more efficiently reduce stress.

Figure 28:
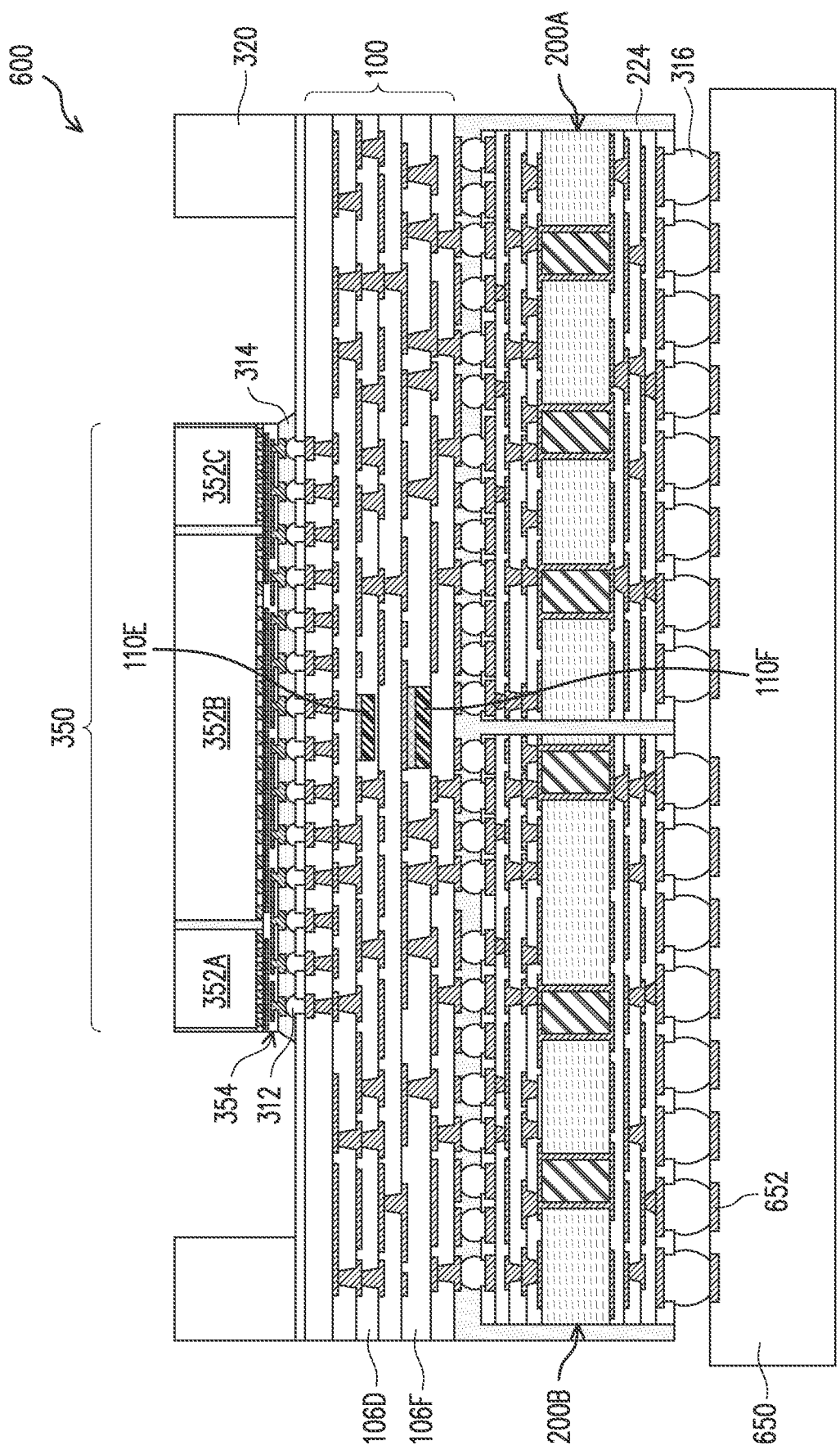

FIG. 28 illustrates a cross-sectional view of a package structure 600 that includes internal supports 110E-F within different layers of the redistribution structure 100, in accordance with some embodiments. The package structure 600 is similar to the package structure 400 shown in FIG. 18, except for internal supports 110 located within different layers of the redistribution structure 100. As shown in FIG. 28, internal support 110E is located within the dielectric layer 106E, and internal support 110F is located within the dielectric layer 106F. Internal supports 110 may be located within different layers of the redistribution structure 100 than shown, or a different number of internal supports 110 may be located within a different number of layers than shown. The internal supports 110E and 110F shown in FIG. 28 are laterally overlapping, but in other embodiments, internal supports 110 formed on different layers of the redistribution structure 100 may be laterally separated. By placing internal supports 110 within multiple layers of the redistribution structure 100, greater stability to the redistribution structure 100 (or the routing structure 354) may be achieved, with improved reduction of stress.

As an example, FIG. 28 also illustrates the package structure 600 attached to a package substrate 650, in accordance with some embodiments. Other package structures described herein may be attached to a package substrate in a similar manner, in some embodiments. The package structure 600 is attached to the package substrate 650 using the external connectors 316. The package substrate 650 may be made of a semiconductor material (e.g., silicon or another semiconductor), a semiconductor-on-insulator (SOI) substrate, or the like. In some embodiments, the package substrate 650 is formed using a core substrate similar to the core substrate 202 of the interconnect structure 200 described for FIG. 11. For example, the package substrate 650 may be a PCB or the like. The package substrate 650 may include active and/or passive devices (not shown). As one of ordinary skill in the art will recognize, a wide variety of devices such as transistors, capacitors, resistors, combinations of these, and the like may be used to generate the structural and functional requirements of the design for the device stack. The devices may be formed using any suitable methods.

The package substrate 650 may also include metallization layers and vias (not shown) and bond pads 652 over the metallization layers and vias. The metallization layers may be formed over the active and/or passive devices and are designed to connect the various devices to form functional circuitry. In some embodiments, the metallization layers may be formed of alternating layers of dielectric (e.g., low-k dielectric material) and conductive material (e.g., copper)

with vias interconnecting the layers of conductive material and may be formed through any suitable process (such as deposition, damascene, dual damascene, or the like). In some embodiments, the package substrate 650 is substantially free of active and passive devices. In some embodiments, the external connectors 316 are reflowed to attach the package structure 600 to the bond pads 652. The external connectors 316 electrically and/or physically couple the package substrate 650, including metallization layers in the package substrate 650, to the package structure 600. In some embodiments, an underfill (not shown) may be formed between the package structure 600 and the package substrate 650 and surrounding the external connectors 316. The underfill may be formed by a capillary flow process after the package structure 600 is attached or may be formed by a suitable deposition method before the package structure 600 is attached.

Figure 29:
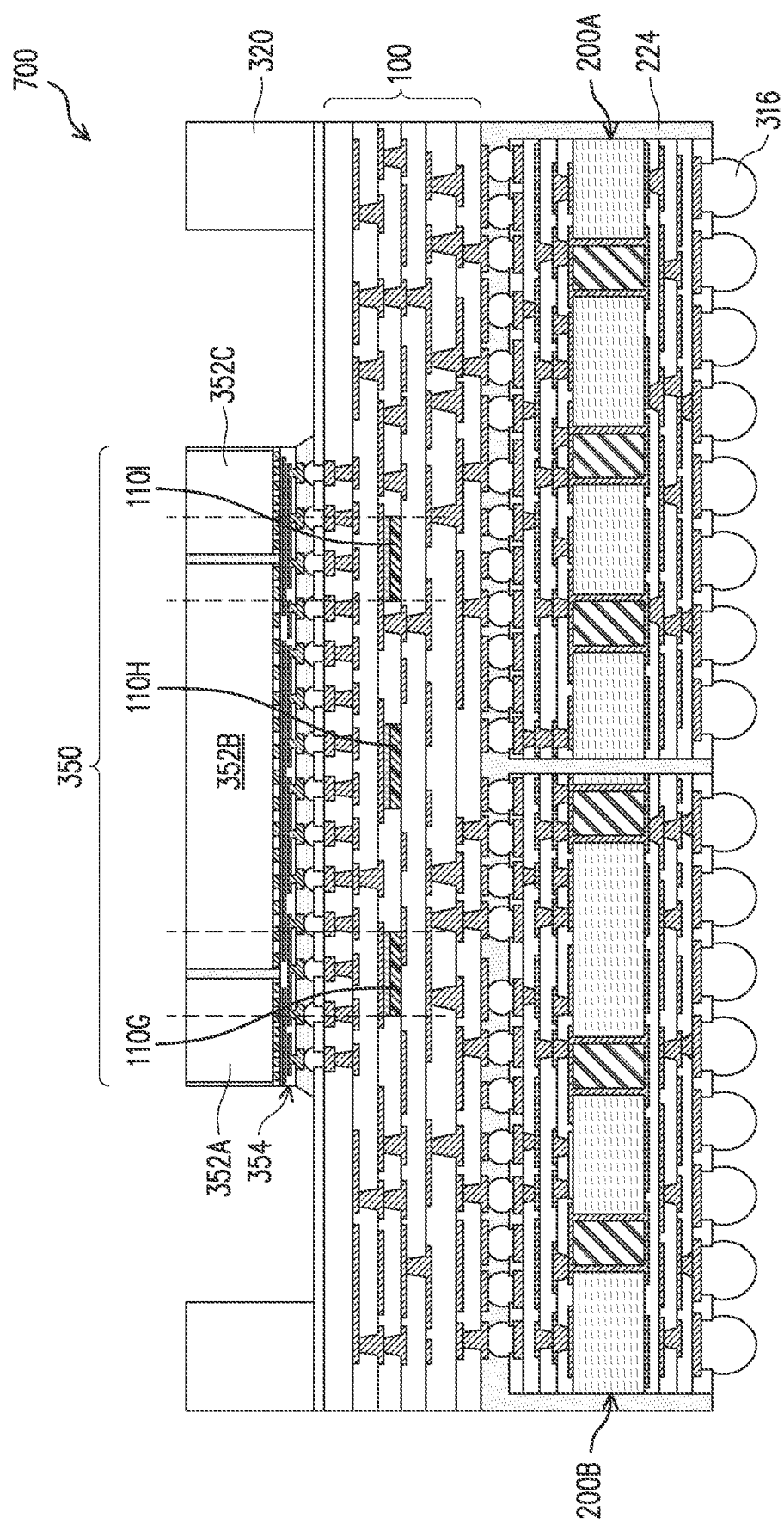

FIG. 29 illustrates a cross-sectional view of a package structure 700 that includes internal supports 110G-I to reduce stress due to multiple integrated circuit dies 352A-C within the integrated circuit package 350, in accordance with some embodiments. The package structure 700 is similar to the package structure 400 shown in FIG. 18. In some cases, multiple integrated circuit dies 352 within an integrated circuit package 350 can cause stress within the redistribution structure 100 or the routing structure 354. In some cases, regions of greatest stress may be approximately laterally aligned with the gap between adjacent integrated circuit dies 352. In this manner, stress may be reduced by laterally aligning the internal supports 110 with the gaps between adjacent integrated circuit dies 352 or aligning the internal supports 110 such that they laterally overlap adjacent pairs of integrated circuit dies 352. This is shown in FIG. 29, in which an internal support 110G is placed such that it laterally overlaps the integrated circuit dies 352A and 352B, and thus reduces stress due to the integrated circuit dies 352A and 352B. FIG. 29 also shows an internal support 110I placed such that it laterally overlaps the integrated circuit dies 352B and 352C, and thus reduces stress due to the integrated circuit dies 352B and 352C. Internal supports 110 may be located within different layers of the redistribution structure 100 than shown, or a different number of internal supports 110 may be located within a different number of layers than shown. By placing internal supports 110 aligned to the integrated circuit dies 352 as described, greater stability to the redistribution structure 100 (or the routing structure 354) may be achieved, with improved reduction of stress. FIG. 29 also shows an internal support 110H that is laterally aligned with the gap between the interconnect structures 200A and 200B, though in other embodiments the internal support 110 is not present.

Figure 30C:
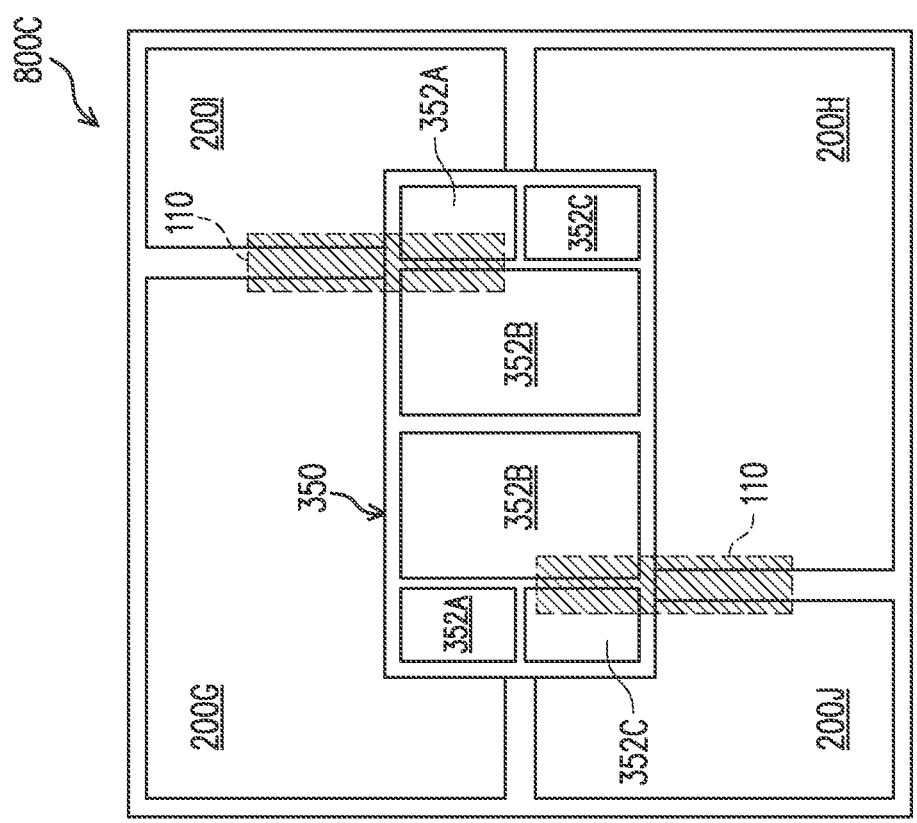

In some embodiments, the greatest stress within the redistribution structure 100 or routing structure 354 may be in a location where a gap between interconnect structures 200 is approximately laterally aligned with a gap between integrated circuit dies 352. For example, a gap between interconnect structures 200 may laterally overlap a gap between integrated circuit dies 352. In situations like this, internal supports 110 may be located so as to be approximately laterally aligned with these gaps. This is shown in FIGS. 30A-C, which shows plan views of package structures 800A, 800B, and 800C in which a gap between interconnect structures 200 is approximately laterally aligned with a gap between integrated circuit dies 352 of an integrated circuit package 350. The integrated circuit packages 350 shown in FIGS. 30A-C may include, for example, logic dies 352B and I/O dies 352A and 352C, though other combinations of integrated circuit dies 352 are possible. The plan views of FIG. 30A-C are similar to the plan view shown in FIG. 15.

In FIG. 30A, the package structure 800A includes four interconnect structures 200 and one internal support 110 within the redistribution structure 100. Each interconnect structure 200 may have dimensions in the range of about 15 mm by 15 mm to about 75 mm by 75 mm, such as about 55 mm by 55 mm, though other sizes are possible. The internal support 110 is laterally aligned to both a gap between interconnect structures 200 and a gap between integrated circuit dies 352B. FIG. 30B illustrates a package structure 800B that includes nine interconnect structures 200 (one is underneath the integrated circuit package 352) and two internal supports 110. Each interconnect structure 200 may have dimensions in the range of about 10 mm by 10 mm to about 50 mm by 50 mm, such as about 36 mm by 36 mm, though other sizes are possible. Each internal support 110 is located to be laterally aligned to both a gap between interconnect structures 200 and a gap between integrated circuit dies 352. In FIG. 30C, the package structure 800C includes four interconnect structures 200G-H of two different sizes and two internal supports 110 within the redistribution structure 100. The larger interconnect structures 200G and 200H may have dimensions in the range of about 10 mm by 15 mm to about 75 mm by 100 mm, such as about 55 mm by 76 mm, though other sizes are possible. The smaller interconnect structures 200I and 200J may have dimensions in the range of about 5 mm by 15 mm to about 50 mm by 75 mm, such as about 34 mm by 55 mm, though other sizes are possible. The internal supports 110 are each laterally aligned to both a gap between interconnect structures 200 and a gap between integrated circuit dies 352. In some cases, aligning an internal support 110 to both a gap between interconnect structures 200 and a gap between integrated circuit dies 352 in this manner can reduce stress more efficiently and reduce the size or number of internal supports 110 used within the redistribution structure 100.

Other features and processes may also be included in the various embodiments described herein. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and techniques disclosed herein may be used in conjunction with testing methodologies that incorporate intermediate verification of known good dies to increase the yield and decrease costs.

By utilizing the embodiments described herein, the performance of a device package may be improved, and the reliability of a device package may be improved. Different features of embodiments described herein may be combined to achieve these and other benefits. In some cases, multiple interconnect structures or multiple integrated circuit dies within a package can cause internal stress within the package, which can cause warping and problems associated with warping such as cracking or delamination. The techniques described herein include incorporating one or more internal supports within one or more layers of a redistribution structure of the package to provide structural support and reduce stress. The internal supports may be placed in suitable locations within the redistribution structure to provide more efficient reduction of stress. For example, the internal supports may be laterally aligned with a gap between adjacent interconnect structures or adjacent integrated circuit dies. This can allow multiple interconnect structures to be used within a package without increased warping, which can reduce the cost of a package. The techniques described herein are also applicable for bonding a variety of structures to form different types of packages. Additionally, using process techniques as described may result in improved yield and improved connection reliability, especially for packages having larger areas. For example, the techniques described herein can reduce stress in large packages having dimensions greater than 80 mm by 80 mm (e.g., greater than 100 mm by 100 mm), such as such as system on integrated substrate (SoIS) packages or other types of packages. The techniques described herein can also reduce fine line stress for redistribution structures having finer conductive features, such as conductive features having linewidths or line spaces of less than about 2 µm. For example, the process techniques described herein may reduce warpage and thus also reduce problems such as cracking or delamination associated with warping.

In some embodiments, a device includes a redistribution structure, including conductive features; dielectric layers; and an internal support within a first dielectric layer of the dielectric layers, wherein the internal support is free of passive and active devices; a first interconnect structure attached to a first side of the redistribution structure; a second interconnect structure attached to the first side of the redistribution structure, wherein the second interconnect structure is laterally adjacent the first interconnect structure, wherein the internal support laterally overlaps both the first interconnect structure and the second interconnect structure. In an embodiment, the internal support is ceramic. In an embodiment, the internal support is between a second dielectric layer and a third dielectric layer of the dielectric layers. In an embodiment, the internal support is a first internal support of multiple first internal supports, wherein the multiple first internal supports are within the first dielectric layer. In an embodiment, the device includes multiple second internal supports, wherein the multiple second internal supports are within a fourth dielectric layer of the dielectric layers. In an embodiment, the device includes an integrated circuit package attached to a second side of the redistribution structure, wherein the integrated circuit package includes a first integrated circuit die and a second integrated circuit die laterally adjacent the first integrated circuit die. In an embodiment, the internal support laterally overlaps both the first integrated circuit die and the second integrated circuit die. In an embodiment, the device includes a die attach film on the internal support. In an embodiment, the internal support has a thickness in the range of 15 µm to 100 µm. In an embodiment, the internal support laterally overlaps the first interconnect structure a distance in the range of 20 µm to 500 µm.

In some embodiments, a structure includes multiple core substrates attached to a first side of a redistribution structure, wherein the redistribution structure includes multiple first redistribution layers; multiple internal supports attached to at least one of the multiple first redistribution layers, wherein the multiple internal supports are free of electrical connection to the multiple first redistribution layers; and multiple second redistribution layers on the multiple first redistribution layers and over the multiple internal supports, wherein the multiple internal supports are free of electrical connection to the multiple second redistribution layers; and an integrated device package attached to a second side of the redistribution structure. In an embodiment, the multiple internal supports are vertically separated from the multiple core substrates by a vertical distance in the range of 100 µm to 15,000 µm. In an embodiment, the first redistribution layers include first dielectric layers, wherein the second redistribution layers include second dielectric layers that are a different dielectric material from first dielectric layers. In an embodiment, the internal supports are silicon. In an embodiment, the internal supports laterally overlap at least two respective core substrates. In an embodiment, the integrated device package includes multiple dies, and wherein the internal supports laterally overlap at least two respective dies.

In some embodiments, a method includes forming first redistribution layers over a carrier; attaching an internal support to the first redistribution layers, wherein the internal support is an electrically inert material; forming a second redistribution layers over the first redistribution layers and over the internal support; attaching a first interconnect substrate and a second interconnect substrate to the second redistribution layers, wherein the first interconnect substrate is laterally separated from the second interconnect substrate by a gap, wherein the gap is laterally aligned with the internal support; and attaching integrated circuit dies to the first redistribution layers. In an embodiment, the first redistribution layers are formed using a different technique than the second redistribution layers. In an embodiment, the method includes depositing an underfill material on the first interconnect structure and the second interconnect structure. In an embodiment, the internal support is attached to the first redistribution layers using a die attach film.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a plurality of first redistribution layers over a carrier;
    attaching a first internal support to the plurality of first redistribution layers, wherein the first internal support is an electrically inert material;
    forming a plurality of second redistribution layers over the plurality of first redistribution layers and over the first internal support;
    attaching a first interconnect substrate and a second interconnect substrate to the plurality of second redistribution layers, wherein the first interconnect substrate is laterally separated from the second interconnect substrate by a gap, wherein the gap is laterally aligned with the first internal support; and
    attaching a plurality of integrated circuit dies to the plurality of first redistribution layers.

2. The method of claim 1, wherein the plurality of first redistribution layers is formed using a different technique than the plurality of second redistribution layers.

3. The method of claim 1, further comprising depositing an underfill material on the first interconnect structure and the second interconnect structure.

4. The method of claim 1, wherein the first internal support is attached to the plurality of first redistribution layers using a die attach film.

5. The method of claim 1, wherein the first internal support comprises ceramic.

6. The method of claim 1 further comprising attaching a second internal support to the plurality of first redistribution layers.

7. The method of claim 1, wherein the plurality of second redistribution layers comprise a different dielectric material than the plurality of first redistribution layers.

8. The method of claim 1, wherein the first internal support has a length in the range of 2 mm to 60 mm.

9. A method comprising:
- attaching a plurality of first dummy dies to a first redistribution structure, wherein the first dummy dies comprise an insulating material;
- forming a second redistribution structure on the first redistribution structure and the plurality of first dummy dies, wherein the second redistribution structure is electrically coupled to the first redistribution structure; and
- attaching a plurality of interconnect structures to the second redistribution structure, wherein the plurality of interconnect structures are electrically coupled to the second redistribution structure, wherein at least one first dummy die of the plurality of first dummy dies laterally overlaps at least two respective interconnect structures of the plurality of interconnect structures.

10. The method of claim 9 further comprising forming a first dielectric layer over the plurality of first dummy dies.

11. The method of claim 10 further comprising planarizing the first dielectric layer to expose top surfaces of the plurality of first dummy dies.

12. The method of claim 9 further comprising attaching a plurality of second dummy dies to a third redistribution structure, wherein the first redistribution structure is formed on the third redistribution structure.

13. The method of claim 12, wherein at least one first dummy die laterally overlaps at least one second dummy die.

14. The method of claim 9 further comprising connecting a semiconductor device to the first redistribution structure opposite the second redistribution structure.

15. The method of claim 14, wherein the semiconductor device comprises a plurality of semiconductor dies, wherein at least one first dummy die of the plurality of first dummy dies laterally overlaps at least two respective semiconductor dies of the plurality of semiconductor dies.

16. The method of claim 9, wherein the dummy die comprises silicon carbide.

17. A method comprising:
- forming a first redistribution structure, comprising:
  - forming a first metallization pattern on a first dielectric layer;
  - placing an internal support structure on the metallization pattern;
  - forming a second dielectric layer over the first metallization pattern and the internal support structure; and
  - forming a second metallization pattern on the second dielectric layer, wherein the second metallization pattern is electrically coupled to the first metallization pattern;
- connecting a first core substrate to the first redistribution structure, wherein the first core substrate extends over the internal support structure; and
- connecting a second core substrate to the first redistribution structure, wherein the second core substrate extends over the internal support structure.

18. The method of claim 17, wherein the internal support structure comprises a metal.

19. The method of claim 17, wherein the second metallization pattern physically contacts the internal support structure.

20. The method of claim 17 further comprising connecting a third core substrate to the first redistribution structure, wherein the third core substrate extends over the internal support structure.

* * * * *